United States Patent
Snaith et al.

(10) Patent No.: US 11,820,670 B2
(45) Date of Patent: *Nov. 21, 2023

(54) DOUBLE PEROVSKITE

(71) Applicant: OXFORD UNIVERSITY INNOVATION LIMITED, Oxford (GB)

(72) Inventors: Henry James Snaith, Oxford (GB); Amir Abbas Hagighirad, Oxford (GB); Feliciano Giustino, Oxford (GB); Marina Filip, Oxford (GB); George Volonakis, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/167,705

(22) Filed: Feb. 4, 2021

(65) Prior Publication Data

US 2021/0230014 A1 Jul. 29, 2021

Related U.S. Application Data

(63) Continuation of application No. 15/756,346, filed as application No. PCT/GB2016/052691 on Aug. 31, 2016, now Pat. No. 10,927,013.

(30) Foreign Application Priority Data

Sep. 2, 2015 (GB) .................................... 1515546
Mar. 4, 2016 (GB) .................................... 1603804

(51) Int. Cl.
*C01G 29/00* (2006.01)
*C01G 30/00* (2006.01)
(Continued)

(52) U.S. Cl.
CPC ......... *C01G 29/006* (2013.01); *C01G 30/006* (2013.01); *H01G 9/0036* (2013.01);
(Continued)

(58) Field of Classification Search
None
See application file for complete search history.

(56) References Cited

U.S. PATENT DOCUMENTS 4,478,879 A 10/1984 Baraona
4,927,770 A 5/1990 Swanson
(Continued)

FOREIGN PATENT DOCUMENTS

WO 2015016114 A1 2/2015
WO 2015031944 A1 3/2015
WO 2015032748 A1 3/2015

OTHER PUBLICATIONS

Baikie, et al., Synthesis and Crystal Chemistry of the Hybrid Perovskite (CH3NH3)PbI3 for Solid-State Sensitised Solar Cell Applications, Journal of Materials Chemistry A, 2013, 1:5628-5641.
(Continued)

*Primary Examiner* — Daniel P Malley, Jr.
(74) *Attorney, Agent, or Firm* — QUARLES & BRADY LLP

(57) ABSTRACT

The present invention relates to a semiconductor device comprising a semiconducting material, wherein the semiconducting material comprises a compound comprising: (i) one or more first monocations [A]; (ii) one or more second monocations [$B^I$]; (iii) one or more trications [$B^{III}$]; and (iv) one or more halide anions [X]. The invention also relates to a process for producing a semiconductor device comprising said semiconducting material. Also described is a compound comprising: (i) one or more first monocations [A]; (ii) one
(Continued)

or more second monocations [B$^I$] selected from Cu$^+$, Ag$^+$ and Au$^+$; (iii) one or more trications [B$^{III}$]; and (iv) one or more halide anions [X].

26 Claims, 9 Drawing Sheets

(51) Int. Cl.

| | |
|---|---|
| H10K 30/30 | (2023.01) |
| H10K 71/15 | (2023.01) |
| H10K 71/40 | (2023.01) |
| H10K 85/00 | (2023.01) |
| H10K 85/30 | (2023.01) |
| H01G 9/00 | (2006.01) |
| H01G 9/20 | (2006.01) |
| H10K 30/15 | (2023.01) |

(52) U.S. Cl.
CPC ......... *H01G 9/2009* (2013.01); *H01G 9/2018* (2013.01); *H10K 30/30* (2023.02); *H10K 71/15* (2023.02); *H10K 71/441* (2023.02); *H10K 85/00* (2023.02); *H10K 85/361* (2023.02); *H10K 85/371* (2023.02); *C01P 2002/34* (2013.01); *C01P 2002/72* (2013.01); *C01P 2002/76* (2013.01); *C01P 2002/77* (2013.01); *C01P 2002/84* (2013.01); *H10K 30/151* (2023.02); *Y02E 10/549* (2013.01)

(56) References Cited

U.S. PATENT DOCUMENTS

| | | | |
|---|---|---|---|
| 10,079,356 B2 | 9/2018 | Etgar | |
| 2015/0340632 A1* | 11/2015 | Etgar | H01L 51/0077 438/93 |
| 2016/0141111 A1* | 5/2016 | Sato | H01G 9/2004 136/263 |
| 2016/0155974 A1* | 6/2016 | Wang | H01L 31/18 136/265 |
| 2018/0248052 A1* | 8/2018 | Seok | H01L 31/022425 |
| 2018/0277309 A1* | 9/2018 | Etgar | H01L 51/0077 |
| 2018/0309063 A1* | 10/2018 | Kawata | H01L 51/0032 |

OTHER PUBLICATIONS

Eperon, et al., Formamidinium Lead Trihalide: A Broadly Tunable Perovskite for Efficient Planar Heterojunction Solar Cells, Energy & Environmental Science, 2014, 7:982-988.
Filip, et al., GW Quasiparticle Band Structures of Stibnite, Antimonselite, Bismuthinite, and Guanajuatite, Physical Review B, 2013, 87(20):205125, 12 pages.
Filip, et al., Steric Engineering of Metal-Halide Perovskites with Tunable Optical Band Gaps, Nature Communications, 2014, 5:5757, 9 pages.
Filip, et al., Computational Screening of Homovalent Lead Substitution in Organic-Inorganic Halide Perovskites, Journal of Physical Chemistry C, 2016, 120:166-173.
Giorgi, et al., Alternative, Lead-Free, Hybrid Organic-Inorganic Perovskites for Solar Applications: A DFT Analysis, Chemistry Letters, 2015, 44:826-828.
Green, et al., The Emergence of Perovskite Solar Cells, Nature Photonics, 2014, 8:506-514.
Haber, Manual on Catalyst Characterization, Pure and Applied Chemistry, 1991, 63(9):1227-1246.
Hirade, et al., Small Molecular Organic Photovoltaic Cells with Exciton Blocking Layer at Anode Interface for Improved Device Performance, Applied Physics Letters, 2011, 99:153302, 3 pages.
Kojima, 2000, "Gold Valence Transition and Phase Diagram in the Mixed-Valence Complexes", The Chemical Society of Japan, 73, all pages. (Year:2000).
Li, et al., Formability of ABX3 (X=F, Cl, Br, I) Halide Perovskites, Acta Crystallographica Section B: Structural Science, 2008, 64(6):702-707.
McClure, et al., Cs2AgBiX6 (X=Br, Cl): New Visible Light Absorbing, Lead Free Halide Perovskite Semiconductors, Chemistry of Materials, 2016, 28:1348-1354.
Pellet, et al., Mixed-Organic-Cation Perovskite Photovoltaics for Enhanced Solar-Light Harvesting, Angewandte Chemie International Edition, 2014, 53(12):3151-3157.
Peumans, et al., Small Molecular Weight Organic Thin-Film Photodetectors and Solar Cells, Journal of Applied Physics, 2003, 93(7):3693-3723.
Pilania, et al., Cation Ordering and Effect of Biaxial Strain in Double Perovskite CsRbCaZnCl6, Journal of Applied Physics, 2015, 117:114103, 9 pages.
Rouquerol, et al., Recommendations for the Characterization of Porous Solids, Pure and Applied Chemistry, 1994, 66(8):1739-1758.
Sing, et al., Reporting Physisorption Data for Gas/Solid Systems with Special Reference to the Determination of Surface Area and Porosity, Pure and Applied Chemistry, 1985, 57(4):603-619.
Slavney, et al., A Bismuth-Halide Double Perovskite with Long Carrier Recombination Lifetime for Photovoltaic Applications, Journal of the American Chemical Society, 2016, 138:2138-2141.
STN Structure Search, 2020, All Pages. (Year: 2020).
Stoumpos, et al., Semiconducting Tin and Lead Iodide Perovskites with Organic Cations: Phase Transitions, High Mobilities, and Near-Infrared Photoluminescent Properties, Inorganic Chemistry, 2013, 52:9019-9038.
Sun, et al., Discovering Lead-Free Perovskite Solar Materials with a Split-Anion Approach, Nanoscale, 2016, 8:6284-6289.
Van Loef, et al., Scintillation and Spectroscopy of the Pure and Ce3+-doped Elpasolites: Cs2LiYX6 (X=Cl, Br), Journal of Physics: Condensed Matter, 2002, 14:8481-8496.
Vasala, et al., A2B' B "O6 Perovskites: A Review, Progress in Solid State Chemistry, 2015, 43(1):1-36.
Volonakis, et al., Lead-Free Halide Double Perovskites via Heterovalent Substitution of Noble Metals, Journal of Physical Chemistry Letters, 2016, 7:1254-1259.
Wei, et al., The Synthesis, Structure and Electronic Properties of a Lead-Free Hybrid Inorganic-Organic Double Perovskite (MA)2KBiCl6 (MA=methylammonium), Materials Horizons, 2016, 3:328-332.

* cited by examiner

DOUBLE PEROVSKITE

CROSS-REFERENCE TO RELATED APPLICATIONS

This application is a continuation of U.S. patent application Ser. No. 15/756,346 filed Feb. 28, 2018, which represents the national stage entry of PCT International Application No. PCT/GB2016/052691 filed Aug. 31, 2016, which claims priority to Great Britain Patent Application 1515546.8 filed Sep. 2, 2015, and Great Britain Patent Application 1603804.4 filed Mar. 4, 2016, the contents of which are hereby incorporated herein by reference for all purposes.

FIELD OF THE INVENTION

The present invention relates a semiconductor device comprising a semiconducting material and a process for producing a semiconductor device. The invention also relates to novel compounds comprising metal monocations.

The work leading to this invention has received funding from the European Community's Seventh Framework Programme (FP7/2007-2013) under grant agreement agreements 279881, 239578 (ALIGN), 604032 of the MESO project and 604391 (Graphene Flagship).

BACKGROUND OF THE INVENTION

The development of efficient, cost-effective, and scalable solar energy technologies constitutes a top priority in the global energy research agenda. The past five years have witnessed a revolution in photovoltaics research with the discovery of the organic-inorganic perovskite methylammonium lead triiodide ($MAPbI_3$, $MA=CH_3NH_3$), leading to solar cells with an energy conversion efficiency exceeding 20% (Green et al, *The emergence of perovskite solar cells*, Nature Photon. 8, 506-514, 2014). Despite the unprecedented progress in perovskite photovoltaics, the presence of lead in $MAPbI_3$ raises concerns about the potential environmental impact of these devices. Numerous experimental and computational efforts have been devoted to searching for lead-free alternatives to $MAPbI_3$. However, to date no material can rival the remarkable optoelectronic properties of $MAPbI_3$. $MAPbI_3$ is an $ABX_3$ perovskite where the B sites are occupied by the heavy metal cation $Pb^{2+}$, the X sites are occupied by the halide anion $I^-$ and the A sites are occupied by the organic cation MA+. The most obvious route to replacing Pb in this compound would be via substitution of other Group 14 elements, for instance Sn and Ge. However, both elements tend to undergo oxidation, for example from $Sn^{2+}$ to $Sn^{4+}$, leading to a rapid degradation of the corresponding halide perovskites (Stoumpos et al, *Semiconducting tin and lead iodide perovskites with organic cations: phase transitions, high mobilities, and near-infrared photoluminescent properties*, Inorg. Chem. 52, 9019-9038, 2013). Another possible avenue towards lead replacement is substitution by other divalent cations outside of Group 14 elements. To check this possibility the inventors have performed a high-throughput computational screening of potential candidates, but did not succeed in identifying compounds matching the remarkable optoelectronic properties of $MAPbI_3$. Thus, it has unexpectedly been found that no other divalent metal or metalloid cations have the potential to be used instead of lead.

A structure related to perovskites is that of double perovskites which have the formula $A_2B'B''X_6$. Oxide double perovskites are known (Vasala & Karppinen, $A_2B'B''O_6$ *perovskites: A review*, Prog. Solid St. Chem. 43, 1-36, 2015). However, halide double perovskites have not been synthesised. Halide double perovskites using thallium have been proposed in a theoretical study (Giorgi & Yamashita, *Alternative, lead-free, hybrid organic-inorganic perovskites for solar applications: A DEL analysis*, Chem. Lett. 44, 826-828, 2015). However, the replacement of lead by thallium only worsens the toxicity problem. It would appear at present that the there is no clear way forward in the photoactive perovskite field to overcome the problems associated with lead.

There is a need to develop new semiconducting materials which do not comprise lead (or any other toxic heavy metal). Also, compounds which do not comprise lead need to be stable, for instance with respect to oxidation. New semiconducting materials with a range of electronic properties are also desired, as are new semiconducting materials useful as photoactive materials.

SUMMARY OF THE INVENTION

The inventors have developed a new family of organic-inorganic halide perovskites, whereby lead is completely replaced by one or more trications (for instance bismuth or antimony) and one or more monocations (for instance noble metal cations). Using first-principles electronic structure calculations, double perovskites such as $FA_2AgBiI_6$ ($FA=CH(NH_2)_2$) have been identified as a stable compounds with a band gap suitable for solar cell applications and small carrier effective masses, bearing a striking resemblance to $MAPbI_3$. Compounds of this type have been successfully synthesized. More generally, the inventors investigations have revealed the existence of a hitherto unknown family of materials comprising one or more first monocations [A]; one or more second monocations [$B^I$]; one or more trications [$B^{III}$]; and one or more halide anions [X], for instance double perovskites of formula $[A]_2[B^I][B^{III}][X]_6$ and associated layered double perovskites.

This new class of materials allows the use of lead (and other toxic heavy metals) to be avoided completely, providing a significant environmental benefit. The materials have a strong potential for optimizing lead-free perovskite photovoltaics. The novel double perovskites are also likely to be stable with respect to oxidation.

The invention therefore provides a semiconductor device comprising a semiconducting material, wherein the semiconducting material comprises a compound comprising:
  (i) one or more first monocations [A];
  (ii) one or more second monocations [$B^I$];
  (iii) one or more trications [$B^{III}$]; and
  (iv) one or more halide anions [X].

The invention also provides a process for producing a semiconductor device comprising a semiconducting material, wherein the semiconducting material comprises a compound comprising:
  (i) one or more first monocations [A];
  (ii) one or more second monocations [$B^I$];
  (iii) one or more trications [$B^{III}$]; and
  (iv) one or more halide anions [X],
which process comprises:
(a) disposing a second region on a first region, which second region comprises a layer of said semiconducting material.

The invention further provides a compound comprising:
  (i) one or more first monocations [A];
  (ii) one or more second monocations [$B^I$] selected from $Cu^+$, $Ag^+$ and $Au^+$;

(iii) one or more trications [B$^{III}$]; and
(iv) one or more halide anions [X].

DETAILED DESCRIPTION OF THE INVENTION

Definitions

Figure 1:
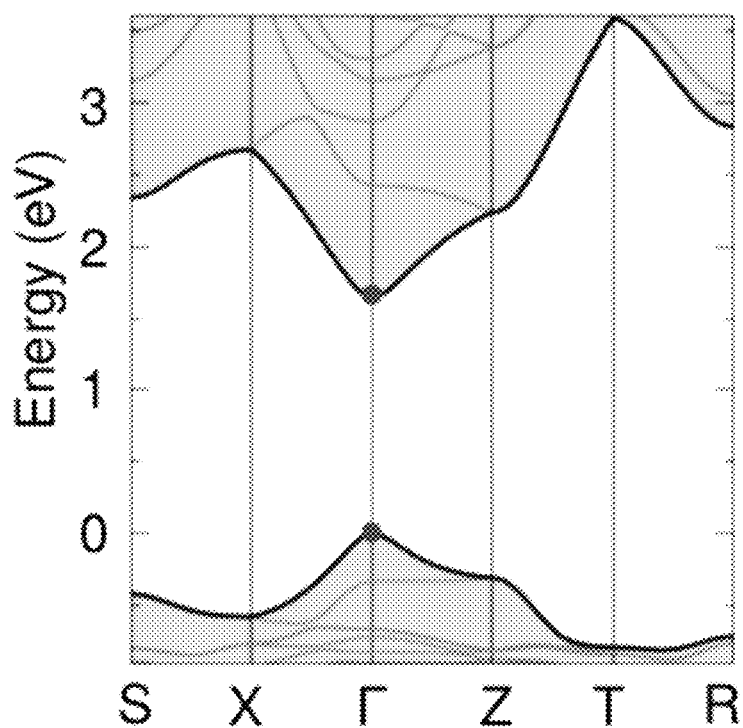
FIG. 1 shows DFT/LDA calculated electronic band structure of MAPbI$_3$, along high-symmetry lines in the Brillouin zone.

The term "photoactive material", as used herein, refers to a material which either (i) absorbs light, which may then generate free charge carriers; or (ii) accepts charge, both electrons and holes, which may subsequently recombine and emit light. A photoabsorbent material is a material which absorbs light, which may then generate free charge carriers (e.g electrons and holes). Photoactive materials are examples of semiconducting materials. A "photoemissive material" is a material which absorbs light of energies higher than band gap and reemits light at energies at the band gap The term "monocation", as used herein, refers to any cation with a single positive charge, i.e. a cation of formula A$^+$ where A is any moiety, for instance a metal atom or an organic moiety. The term "dication", as used herein, refers to any cation with a double positive charge, i.e. a cation of formula A$^{2+}$ where A is any moiety, for instance a metal atom or an organic moiety. The term "trication", as used herein, refers to any cation with a triple positive charge, i.e. a cation of formula A$^{3+}$ where A is any moiety, for instance a metal atom.

The term "semiconductor" or "semiconducting material", as used herein, refers to a material with electrical conductivity intermediate in magnitude between that of a conductor and a dielectric. A semiconductor may be an negative (n)-type semiconductor, a positive (p)-type semiconductor or an intrinsic (i) semiconductor. A semiconductor may have a band gap of from 0.5 to 3.5 eV, for instance from 0.5 to 2.5 eV or from 1.0 to 2.0 eV (when measured at 300 K).

The term "n-type region", as used herein, refers to a region of one or more electron-transporting (i.e. n-type) materials. Similarly, the term "n-type layer" refers to a layer of an electron-transporting (i.e. an n-type) material. An electron-transporting (i.e. an n-type) material could, for instance, be a single electron-transporting compound or elemental material. An electron-transporting compound or elemental material may be undoped or doped with one or more dopant elements.

The term "p-type region", as used herein, refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "alkyl", as used herein, refers to a linear or branched chain saturated hydrocarbon radical. An alkyl group may be a $C_{1-20}$ alkyl group, a $C_{1-14}$ alkyl group, a $C_{1-10}$ alkyl group, a $C_{1-6}$ alkyl group or a $C_{1-4}$ alkyl group. Examples of a $C_{1-10}$ alkyl group are methyl, ethyl, propyl, butyl, pentyl, hexyl, heptyl, octyl, nonyl or decyl. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein).

The term "cycloalkyl", as used herein, refers to a saturated or partially unsaturated cyclic hydrocarbon radical. A cycloalkyl group may be a $C_{3-10}$ cycloalkyl group, a $C_{3-8}$ cycloalkyl group or a $C_{3-6}$ cycloalkyl group. Examples of a $C_{3-8}$ cycloalkyl group include cyclopropyl, cyclobutyl, cyclopentyl, cyclohexyl, cyclohexenyl, cyclohex-1,3-dienyl, cycloheptyl and cyclooctyl. Examples of a $C_{3-6}$ cycloalkyl group include cyclopropyl, cyclobutyl, cyclopentyl, and cyclohexyl.

The term "alkenyl", as used herein, refers to a linear or branched chain hydrocarbon radical comprising one or more double bonds. An alkenyl group may be a $C_{2-20}$ alkenyl group, a $C_{2-14}$ alkenyl group, a $C_{2-10}$ alkenyl group, a $C_{2-6}$ alkenyl group or a $C_{2-4}$ alkenyl group.

Examples of a $C_{2-10}$ alkenyl group are ethenyl (vinyl), propenyl, butenyl, pentenyl, hexenyl, heptenyl, octenyl, nonenyl or decenyl. Examples of $C_{2-6}$ alkenyl groups are ethenyl, propenyl, butenyl, pentenyl or hexenyl. Examples of $C_{2-4}$ alkenyl groups are ethenyl, i-propenyl, n-propenyl, s-butenyl or n-butenyl. Alkenyl groups typically comprise one or two double bonds.

The term "alkynyl", as used herein, refers to a linear or branched chain hydrocarbon radical comprising one or more triple bonds. An alkynyl group may be a $C_{2-20}$ alkynyl group, a $C_{2-14}$ alkynyl group, a $C_{2-10}$ alkynyl group, a $C_{2-6}$ alkynyl group or a $C_{2-4}$ alkynyl group. Examples of a $C_{2-10}$ alkynyl group are ethynyl, propynyl, butynyl, pentynyl, hexynyl, heptynyl, octynyl, nonynyl or decynyl. Examples of $C_{1-6}$ alkynyl groups are ethynyl, propynyl, butynyl, pentynyl or hexynyl. Alkynyl groups typically comprise one or two triple bonds.

The term "aryl", as used herein, refers to a monocyclic, bicyclic or polycyclic aromatic ring which contains from 6 to 14 carbon atoms, typically from 6 to 10 carbon atoms, in the ring portion. Examples include phenyl, naphthyl, indenyl, indanyl, anthrecenyl and pyrenyl groups. The term "aryl group", as used herein, includes heteroaryl groups. The term "heteroaryl", as used herein, refers to monocyclic or bicyclic heteroaromatic rings which typically contains from six to ten atoms in the ring portion including one or more heteroatoms. A heteroaryl group is generally a 5- or 6-membered ring, containing at least one heteroatom selected from O, S, N, P, Se and Si. It may contain, for example, one, two or three heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl.

The term "substituted", as used herein in the context of substituted organic groups, refers to an organic group which bears one or more substituents selected from $C_{1-10}$ alkyl, aryl (as defined herein), cyano, amino, nitro, $C_{1-10}$ alkylamino, di($C_{1-10}$)alkylamino, arylamino, diarylamino, aryl($C_{1-10}$)alkylamino, amido, acylamido, hydroxy, oxo, halo, carboxy, ester, acyl, acyloxy, $C_{1-10}$ alkoxy, aryloxy, halo($C_{1-10}$)alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substitutents.

The term "porous", as used herein, refers to a material within which pores are arranged. Thus, for instance, in a porous scaffold material the pores are volumes within the scaffold where there is no scaffold material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (J. Rouquerol et al., "Recommendations for the Characterization of Porous Solids", Pure & Appl. Chern, Vol. 66, No. 8, pp. 1739-1758, 1994). The following distinctions and definitions were adopted in previous IUPAC documents (K. S. W. Sing, et al, Pure and Appl. Chern, vol. 57, n04, pp 603-919, 1985; and IUPAC "Manual on Catalyst Characterization", J. Haber, Pure and Appl. Chem., vol. 63, pp. 1227-1246, 1991): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid (e.g. a liquid, such as a solution) to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity".

The term "without open porosity", as used herein, therefore refers to a material with no effective open porosity. Thus, a material without open porosity typically has no macropores and no mesopores. A material without open porosity may comprise micropores and nanopores, however. Such micropores and nanopores are typically too small to have a negative effect on a material for which low porosity is desired.

The term "compact layer", as used herein, refers to a layer without mesoporosity or macroporosity. A compact layer may sometimes have microporosity or nanoporosity.

The term "semiconductor device", as used herein, refers to a device comprising a functional component which comprises a semiconductor material. This term may be understood to be synonymous with the term "semiconducting device". Examples of semiconductor devices include a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device and a light-emitting diode. The term "optoelectronic device", as used herein, refers to devices which source, control, detect or emit light. Light is understood to include any electromagnetic radiation. Examples of optoelectronic devices include photovoltaic devices, photodiodes (including solar cells), phototransistors, photomultipliers, photoresistors, light emitting devices, light emitting diodes and charge injection lasers.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Semiconductor Device

The invention provides a semiconductor device comprising a semiconducting material, wherein the semiconducting material comprises a compound comprising:
 (i) one or more first monocations [A];
 (ii) one or more second monocations [$B^I$];
 (iii) one or more trications [$B^{III}$]; and
 (iv) one or more halide anions [X].

For instance, [A] may be one, two, three or four different first monocations. [$B^I$] may be one, two, three or four different second monocations. [$B^{III}$] may be one, two, three or four different trications. [X] may be one, two, three or four different halide anions. Typically, [A] is one or two different first monocations. Often, [A] is one first monocation, A. Typically, [$B^I$] is one or two different second monocations. Often, [$B^I$] is one second monocation. Typically, [$B^{III}$] is one or two different trications. Often, [$B^{III}$] is one trication. Typically, [X] is one or two different halide anions. Often, [X] is one halide anion.

For instance, if [A] is one first monocation (A), [B$^I$] is one second monocation (B$^I$), [B$^{III}$] is one trications (B$^{III}$) and [X] is two halide anions (X$^1$ and X$^2$), the crystalline material may comprise a compound of formula $A_aB^I{}_{bI}B^{III}{}_{bIII}(X^1, X^2)_c$, where a, bI, bIII and c are integers from 1 to 10. If [A], [B$^I$], [B$^{III}$] or [X] is more than one ion, those ions may be present in any proportion. For instance, $A_aB^I{}_{bI}B^{III}{}_{bIII}(X^1, X^2)_c$ includes all compounds of formula $A_aB^I{}_{bI}B^{III}{}_{bIII}X^1{}_{yc}X^2{}_{(1-y)c}$ wherein y is between 0 and 1, for instance from 0.05 to 0.95. Such materials may be referred to as mixed ion materials (for instance a mixed halide material). In such mixed ion materials, the two ions which are mixed (e.g. X$^1$ and X$^2$) may be distributed across the sites for those ions in an ordered or disordered manner.

The one or more first monocations [A] are typically selected from metal monocations, metalloid monocations and organic monocations, more typically metal monocations and organic monocations. Metals are typically metals selected from Groups 1 to 15 of the periodic table, and include the alkali metals, the alkali earth metals, the d-block elements, and p-block metals such as Al, Ga, In, Tl, Sn, Pb and Bi. Metalloids are usually taken to be the elements which are B, Si, Ge, As, Sb and Te. Organic monocations are typically monocations comprising at least one carbon atom and at least one hydrogen atom. Often, organic monocations comprise a hydrogen atom bonded to a carbon atom (for instance in methylammonium, $CH_3NH_3^+$), but also in some cases do not (for instance in guanidinium, $C(NH_2)_3^+$). Typically, if [A] comprises an organic monocations, the organic monocation comprises at least one carbon atom, at least one hydrogen atom and at least one nitrogen cation. For instance, [A] may comprise one or more organic ammonium cations.

Typically, the one or more first monocations [A] are selected from K$^+$, Rb$^+$, Cs$^+$, $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, wherein each of R$^1$, R$^2$, R$^3$, R$^4$, R$^5$ and R$^6$ is independently H, a substituted or unsubstituted $C_{1-20}$ alkyl group, a substituted or unsubstituted $C_{2-20}$ alkenyl group, a substituted or unsubstituted $C_{2-20}$ alkynyl group, a substituted or unsubstituted $C_{3-20}$ cycloalkyl group or a substituted or unsubstituted aryl group. Often such groups are unsubstituted.

Each of R$^1$, R$^2$, R$^3$, R$^4$, R$^5$ and R$^6$ may independently be H, a substituted or unsubstituted $C_{1-20}$ alkyl group or a substituted or unsubstituted aryl group, for instance H, an unsubstituted $C_{1-20}$ alkyl group, a $C_{1-20}$ alkyl group substituted with one or two aryl groups, an unsubstituted aryl group, or an aryl group substituted with one or two $C_{1-20}$ alkyl groups. Preferably, Each of R$^1$, R$^2$, R$^3$, R$^4$, R$^5$ and R$^6$ is independently H, methyl, hydroxymethyl, ethyl, n-propyl, isopropyl, phenyl, methylphenyl (-Ph-CH$_3$), ethylphenyl (-Ph-CH$_2$CH$_3$), benzyl (—CH$_2$-Ph) or phenylethyl (—CH$_2$CH$_2$-Ph).

Preferably, the one or more first monocations [A] are selected from $(NH_4)^+$, $(CH_3NH_3)^+$, $(HOCH_2NH_3)^+$, $(CH_3CH_2NH_3)^+$, $(H_2N-C(H)=NH_2)^+$ and $(H_2N-C(NH_2)=NH_2)^+$. More preferably the one or more first monocations [A] are methyl ammonium $(CH_3NH_3)^+$ or formamidinium $(H_2N-C(H)=NH_2)^+$. Alternatively, the one or more first monocations [A] may be Cs$^+$.

The one or more second monocations [B$^I$] are typically selected from metal and metalloid monocations. Preferably, the one or more second monocations [B$^I$] are selected from Li$^+$, Na$^+$, K$^+$, Rb$^+$, Cs$^+$, Cu$^+$, Ag$^+$, Au$^+$ and Hg$^+$. More preferably, the one or more second monocations [B$^I$] are selected from Cu$^+$, Ag$^+$ and Au$^+$. Most preferably, the one or more second monocations [B$^I$] are selected from Ag$^+$ and Au$^+$. For instance, [B$^I$] may be one second monocation which is Ag$^+$ or [B$^I$] may be one second monocation which is Au$^+$.

The one or more trications [B$^{III}$] are typically selected from metal and metalloid trications. preferably, the one or more trications [B$^{III}$] are selected from Bi$^{3+}$, Sb$^{3+}$, Cr$^{3+}$, Fe$^{3+}$, Co$^{3+}$, Ga$^{3+}$, As$^{3+}$, Ru$^{3+}$, Rh$^{3+}$, In$^{3+}$, Ir$^{3+}$ and Au$^{3+}$. More preferably, the one or more trications [B$^{III}$] are selected from Bi$^{3+}$ and Sb$^{3+}$. For instance, [B$^{III}$] may be one trication which is Bi$^{3+}$ or [B$^{III}$] may be one second monocation which is Sb$^{3+}$. Bismuth has relatively low toxicity compared with heavy metals such as lead.

In some embodiments, the one or more second monocations [B$^I$] are selected from Cu$^+$, Ag$^+$ and Au$^+$ and the one or more trications [B$^{III}$] are selected from Bi$^{3+}$ and Sb$^{3+}$.

Typically, the one or more halide anions [X] are selected from E, Br, CE and F. Preferably, the one or more halide anions [X] are selected from CE, E and Br. More preferably, the one or more halide anions [X] are selected from E and Br. In some cases, the one or more halide anions are one halide anion, E.

The compound is typically a crystalline compound. A crystalline compound is a compound having an extended 3D crystal structure. A crystalline compound is typically in the form of crystals or, in the case of a poly crystalline compound, crystallites (i.e. a plurality of crystals having particle sizes of less than or equal to 1 μm). The crystals together often form a layer. An extended 3D crystal structure is a structure wherein the compound comprises an ordered array of ions occupying positions within a crystal lattice. The compound typically adopts a structure related to the perovskite structure, and in particular a double perovskite structure or a layered double perovskite structure. The term "perovskite", as used herein, refers to a material with a three-dimensional crystal structure related to that of CaTiO$_3$ or a material comprising a layer of material, which layer has a structure related to that of CaTiO$_3$. The structure of CaTiCO$_3$ can be represented by the formula ABX$_3$, wherein A and B are cations of different sizes and X is an anion. In the unit cell, the A cations are at (0,0,0), the B cations are at (½, ½, ½) and the X anions are at (½, ½, 0). In a double perovskite structure, the compound is represented by the formula $AB^I{}_{0.5}B^{III}{}_{0.5}X_3$ (equivalent to $A_2B^IB^{III}X_6$) and half of the B sites at (½, ½, ½) are occupied by B$^I$ monocations and the other half of the B sites are occupied by B$^{III}$ trications. The occupation of the B sites by the B$^I$ and B$^{III}$ cations may be ordered or disordered. Typically, the arrangement of the B$^I$ and B$^{III}$ cations in the B sites on the lattice are ordered. Often, the B$^I$ and B$^{III}$ cations in the B sites on the lattice are arranged in a "chequerboard" fashion with B$^I$ and B$^{III}$ cations alternating along each of the three axes of the lattice. A layered double perovskite has a structure comprising layers of the double perovskite structure and may, for instance have the formula $A_2B^I{}_{0.5}B^{III}{}_{0.5}X_4$ (equivalent to $A_4B^IB^{III}X_8$).

Typically, the compound is a double perovskite compound of formula (I):

$$[A]_2[B^I][B^{III}][X]_6 \qquad (I);$$

wherein: [A] is the one or more first monocations; [B$^I$] is the one or more second monocations; [B$^{III}$] is the one or more trications; and [X] is the one or more halide anions.

Often, the one or more first monocations [A] is one first monocation A; the one or more second monocations [B$^I$] is one second monocation B$^I$; and the one or more trications

[B^III] is one trications B^III The one or more halide anions [X] may be one halide anion X, or two or more halide anions [X]. In the latter case (two or more different halide anions), the double perovskite is a mixed-halide double perovskite.

Typically, the compound is a double perovskite compound of formula (Ia):

$$A_2B^IB^{III}[X]_6 \qquad (Ia);$$

wherein: A is one first monocation; $B^I$ is one second monocation; $B^{III}$ is one trication; and [X] is the one or more halide anions, for instance two or more halide anions.

If [X] is two or more halide anions, the compound may be a mixed halide double perovskite compound of formula (Ib):

$$A_2B^IB^{III}X_{6(1-x)}X'_{6x} \qquad (Ib);$$

wherein: A is one first monocation; $B^I$ is one second monocation; $B^{III}$ is one trication; X is one halide anion; X' is a different halide anion; and x is from 0.01 to 0.99, for instance from 0.05 to 0.95 or from 0.2 to 0.8.

Examples of mixed halide double perovskites according to the invention include $(H_2N\text{---}C(H)\text{=}NH_2)_2AgBiX_{6(1-x)}X'_{6x}$, $(H_2N\text{---}C(H)\text{=}NH_2)_2AuBiX_{6(1-x)}X'_{6x}$, $(H_2N\text{---}C(H)\text{=}NH_2)_2AgSbX_{6(1-x)}X'_{6x}$, $(H_2N\text{---}C(H)\text{=}NH_2)_2AuSbX_{6(1-x)}X'_{6x}$, $(CH_3NH_3)_2AgBiX_{6(1-x)}X'_{6x}$, $(CH_3NH_3)_2AuBiX_{6(1-x)}X'_{6x}$, $(CH_3NH_3)_2AgSbX_{6(1-x)}X'_{6x}$ and $(CH_3NH_3)_2AuSbX_{6(1-x)}X'_{6x}$ wherein X is a first halide anion (for instance I⁻) and X' is a second, different, halide anion (for instance Br⁻ or Cl⁻) and x is from 0.01 to 0.99, for instance from 0.05 to 0.95 or from 0.2 to 0.8.

Often, however, the compound is a single halide double perovskite compound of formula (Ic):

$$A_2B^IB^{III}X_6 \qquad (IC);$$

wherein: A is one first monocation; $B^I$ is one second monocation; $B^{III}$ is one tri cation; and X is one halide anion.

The compound is typically $(H_2N\text{---}C(H)\text{=}NH_2)_2AgBiI_6$, $(H_2N\text{---}C(H)\text{=}NH_2)_2AuBiI_6$, $(H_2N\text{---}C(H)\text{=}NH_2)_2CuBiI_6$, $(H_2N\text{---}C(H)\text{=}NH_2)_2AgSbI_6$, $(H_2N\text{---}C(H)\text{=}NH_2)_2AuSbI_6$, $(H_2N\text{---}C(H)\text{=}NH_2)_2CuSbI_6$, $(H_2N\text{---}C(H)\text{=}NH_2)_2AgBiBr_6$, $(H_2N\text{---}C(H)\text{=}NH_2)_2AuBiBr_6$, $(H_2N\text{---}C(H)\text{=}NH_2)_2CuBiBr_6$, $(H_2N\text{---}C(H)\text{=}NH_2)_2AgSbBr_6$, $(H_2N\text{---}C(H)\text{=}NH_2)_2AuSbBr_6$, $(H_2N\text{---}C(H)\text{=}NH_2)_2CuSbBr_6$, $(H_2N\text{---}C(H)\text{=}NH_2)_2AgBiCl_6$, $(H_2N\text{---}C(H)\text{=}NH_2)_2AuBiCl_6$, $(H_2N\text{---}C(H)\text{=}NH_2)_2CuBiCl_6$, $(H_2N\text{---}C(H)\text{=}NH_2)_2AgSbCl_6$, $(H_2N\text{---}C(H)\text{=}NH_2)_2AuSbCl_6$, $(H_2N\text{---}C(H)\text{=}NH_2)_2CuSbCl_6$, $(H_2N\text{---}C(H)\text{=}NH_2)_2AgBiF_6$, $(H_2N\text{---}C(H)\text{=}NH_2)_2AuBiF_6$, $(H_2N\text{---}C(H)\text{=}NH_2)_2CuBiF_6$, $(H_2N\text{---}C(H)\text{=}NH_2)_2AgSbF_6$, $(H_2N\text{---}C(H)\text{=}NH_2)_2AuSbF_6$, $(H_2N\text{---}C(H)\text{=}NH_2)_2CuSbF_6$, $(CH_3NH_3)_2AgBiI_6$, $(CH_3NH_3)_2AuBiI_6$, $(CH_3NH_3)_2CuBiI_6$, $(CH_3NH_3)_2AgSbIe$, $(CH_3NH_3)_2AuSbIe$, $(CH_3NH_3)_2CuSbIe$, $(CH_3NH_3)_2AgBiBr_6$, $(CH_3NH_3)_2AuBiBr_6$, $(CH_3NH_3)_2CuBiBr_6$, $(CH_3NH_3)_2AgSbBr_6$, $(CH_3NH_3)_2AuSbBr_6$, $(CH_3NH_3)_2CuSbBr_6$, $(CH_3NH_3)_2AgBiCl_6$, $(CH_3NH_3)_2AuBiCl_6$, $(CH_3NH_3)_2CuBiCl_6$, $(CH_3NH_3)_2AgSbCl_6$, $(CH_3NH_3)_2AuSbCl_6$, $(CH_3NH_3)_2CuSbCl_6$, $(CH_3NH_3)_2AgBiF_6$, $(CH_3NH_3)_2AuBiF_6$, $(CH_3NH_3)_2CuBiF_6$, $(CH_3NH_3)_2AgSbF_6$, $(CH_3NH_3)_2AuSbF_6$, $(CH_3NH_3)_2CuSbF_6$, $Cs_2AgBiI_6$, $Cs_2AuBiI_6$, $Cs_2CuBiI_6$, $Cs_2AgSbI_6$, $Cs_2AuSbI_6$, $Cs_2CuSbI_6$, $Cs_2AgBiBr_6$, $Cs_2AuBiBr_6$, $Cs_2CuBiBr_6$, $Cs_2AgSbBr_6$, $Cs_2AuSbBr_6$, $Cs_2CuSbBr_6$, $Cs_2AgBiCl_6$, $Cs_2AuBiCl_6$, $Cs_2CuBiCl_6$, $Cs_2AgSbCl_6$, $Cs_2AuSbCl_6$, $Cs_2CuSbI_6$, $Cs_2AgBiF_6$, $Cs_2AuBiF_6$, $Cs_2CuBiF_6$, $Cs_2AgSbF_6$, $Cs_2AuSbF_6$ or $Cs_2CuSbF_6$. It should be noted that any of these compounds may be represented with all the subscript indices halved, i.e. $(H_2N\text{---}C(H)\text{=}NH_2)AgBiI_6$ may equivalently be written $(H_2N\text{---}C(H)\text{=}NH_2)Ag_{0.5}Bi_{0.5}I_3$ and $(CH_3NH_3)_2AgBiI_6$ may equivalently be written $(CH_3NH_3)Ag_{0.5}Bi_{0.5}I_3$.

The first monocation [A] may be a guanidinium cation and the compound may therefore be $(H_2N\text{---}C(NH_2)\text{=}NH_2)_2AgBiI_6$, $(H_2N\text{---}C(NH_2)\text{=}NH_2)_2AuBiI_6$, $(H_2N\text{---}C(NH_2)\text{=}NH_2)_2CuBiI_6$, $(H_2N\text{---}C(NH_2)\text{=}NH_2)_2AgSbI_6$, $(H_2N\text{---}C(NH_2)\text{=}NH_2)_2AuSbI_6$, $(H_2N\text{---}C(NH_2)\text{=}NH_2)_2CuSbI_6$, $(H_2N\text{---}C(NH_2)\text{=}NH_2)_2AgBiBr_6$, $(H_2N\text{---}C(NH_2)\text{=}NH_2)_2AuBiBr_6$, $(H_2N\text{---}C(NH_2)\text{=}NH_2)_2CuBiBr_6$, $(H_2N\text{---}C(NH_2)\text{=}NH_2)_2AgSbBr_6$, $(H_2N\text{---}C(NH_2)\text{=}NH_2)_2AuSbBr_6$, $(H_2N\text{---}C(NH_2)\text{=}NH_2)_2CuSbBr_6$, $(H_2N\text{---}C(NH_2)\text{=}NH_2)_2AgBiCl_6$, $(H_2N\text{---}C(NH_2)\text{=}NH_2)_2AuBiCl_6$, $(H_2N\text{---}C(NH_2)\text{=}NH_2)_2CuBiCl_6$, $(H_2N\text{---}C(NH_2)\text{=}NH_2)_2AgSbCl_6$, $(H_2N\text{---}C(NH_2)\text{=}NH_2)_2AuSbCl_6$, $(H_2N\text{---}C(NH_2)\text{=}NH_2)_2CuSbCl_6$, $(H_2N\text{---}C(NH_2)\text{=}NH_2)_2AgBiF_6$, $(H_2N\text{---}C(NH_2)\text{=}NH_2)_2AuBiF_6$, $(H_2N\text{---}C(NH_2)\text{=}NH_2)_2CuBiF_6$, $(H_2N\text{---}C(NH_2)\text{=}NH_2)_2AgSbF_6$, $(H_2N\text{---}C(NH_2)\text{=}NH_2)_2AuSbF_6$ or $(H_2N\text{---}C(NH_2)\text{=}NH_2)_2CuSbF_6$.

The compound is preferably $(H_2N\text{---}C(H)\text{=}NH_2)_2AgBiI_6$, $(H_2N\text{---}C(H)\text{=}NH_2)_2AuBiI_6$, $(H_2N\text{---}C(H)\text{=}NH_2)_2AgBiBr_6$, $(H_2N\text{---}C(H)\text{=}NH_2)_2AuBiBr_6$, $(H_2N\text{---}C(H)\text{=}NH_2)_2AgSbI_6$, $(H_2N\text{---}C(H)\text{=}NH_2)_2AuSbI_6$, $(H_2N\text{---}C(H)\text{=}NH_2)_2AgSbBr_6$, $(H_2N\text{---}C(H)\text{=}NH_2)_2AuSbBr_6$, $(CH_3NH_3)_2AgBiI_6$, $(CH_3NH_3)_2AuBiI_6$, $(CH_3NH_3)_2AgBiBr_6$, $(CH_3NH_3)_2AuBiBr_6$, $(CH_3NH_3)_2AgSbI_6$, $(CH_3NH_3)_2AuSbI_6$, $(CH_3NH_3)_2AgSbBr_6$ or $(CH_3NH_3)_2AuSbBr_6$. Alternatively, the compound may be $Cs_2AgBiCl_6$, $Cs_2AgSbCl_6$, $Cs_2AuBiCl_6$, or $Cs_2AuSbCl_6$, for instance $Cs_2AgBiCl_6$.

More preferably the compound is $(H_2N\text{---}C(H)\text{=}NH_2)_2AgBiI_6$, $(H_2N\text{---}C(H)\text{=}NH_2)_2AuBiI_6$, $(CH_3NH_3)_2AgBiI_6$ or $(CH_3NH_3)_2AuBiI_6$. In some embodiments the compound is $(H_2N\text{---}C(H)\text{=}NH_2)_2AgBiI_6$ or $(CH_3NH_3)_2AgBiI_6$. The compound may for instance be $(H_2N\text{---}C(H)\text{=}NH_2)_2AgBiI_6$. These compounds can be particularly effective semiconducting materials, for instance for use as photoactive materials or photoemissive materials in photovoltaic devices.

For instance, the compound may be a layered double perovskite compound of formula (II):

$$[A]_4[B^I][B^{III}][X]_8 \qquad (II);$$

wherein: [A] is the one or more first monocations; [$B^I$] is the one or more second monocations; [$B^{III}$] is the one or more tricatons; and [X] is the one or more halide anions.

Typically, the layered double perovskite compound is a double perovskite compound of formula (IIa):

$$A_4B^IB^{III}[X]_8 \qquad (IIa);$$

wherein: A is one first monocation; $B^I$ is one second monocation; $B^{III}$ is one trication; and [X] is the one or more halide anions, for instance two or more halide anions.

If [X] is two or more halide anions, the compound may be a mixed halide layered double perovskite compound of formula (IIb):

$$A_4B^IB^{III}X_{8(1-x)}X'_{8x} \qquad (IIb);$$

wherein: A is one first monocation; $B^I$ is one second monocation; $B^{III}$ is one tri cation; X is one halide anion; X' is a different halide anion; and x is from 0.01 to 0.99, for instance from 0.05 to 0.95 or from 0.2 to 0.8.

For instance the compound may be a layered double perovskite of formula $(R^1NH_3)_4AgBiI_8$, $(R^1NH_3)_4AuBiI_8$, $(R^1NH_3)_4CuBiI_8$, $(R^1NH_3)_4AgSbI_8$, $(R^1NH_3)_4AuSbI_8$, $(R^1NH_3)_4CuSbI_8$, $(R^1NH_3)_4AgBiBr_8$, $(R^1NH_3)_4AuBiBr_8$, $(R^1NH_3)_4CuBiBr_8$, $(R^1NH_3)_4AgSbBr_8$, $(R^1NH_3)_4AuSbBr_8$, $(R^1NH_3)_4CuSbBr_8$, $(R^1NH_3)_4AgBiCl_8$, $(R^1NH_3)_4AuBiCl_8$, $(R^1NH_3)_4CuBiCl_8$, $(R^1NH_3)_4AgSbCl_8$, $(R^1NH_3)_4AuSbCl_8$, $(R^1NH_3)_4CuSbCl_8$, $(R^1NH_3)_4AgBiF_8$, $(R^1NH_3)_4AuBiF_8$, $(R^1NH_3)_4CuBiF_8$, $(R^1NH_3)_4AgSbF_8$, $(R^1NH_3)_4AuSbF_8$ or $(R^1NH_3)_4CuSbF_8$, wherein $R^1$ is an unsubstituted $C_{3-12}$ alkyl group. For instance, $R^1$ may be pentyl, hexyl, heptyl or octyl.

The compound used in the semiconducting device of the invention may be a hybrid compound of a perovskite and a double perovskite. Thus, in some cases the compound further comprises one or more metal or metalloid dications $[B^{II}]$. Preferably, the one or more metal or metalloid dications are selected from $Sn^{2+}$, $Pb^{2+}$, $Cu^{2+}$, $Ge^{2+}$ and $Ni^{2+}$. More preferably, the one or more metal or metalloid dications are $Sn^{2+}$ or $Pb^{2+}$. The metal or metalloid dications occupy some of the B sites in the perovskite structure meaning that B sites are occupied by trications, dications and monocations.

Thus, the semiconducting material may comprise a compound which is a hybrid double perovskite compound of formula (Iz) or a layered hybrid double perovskite compound of formula (IIz):

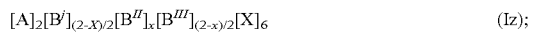

$$[A]_2[B^I]_{(2-x)/2}[B^{II}]_x[B^{III}]_{(2-x)/2}[X]_6 \qquad (Iz);$$

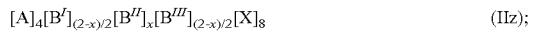

$$[A]_4[B^I]_{(2-x)/2}[B^{II}]_x[B^{III}]_{(2-x)/2}[X]_8 \qquad (IIz);$$

wherein [A] is the one or more first monocations; $[B^I]$ is the one or more second monocations; $[B^{II}]$ is the one or more metal or metalloid dications; $[B^{III}]$ is the one or more trications; [X] is the one or more halide anions; and x is from 0.0 to 1.98. x may be from 0.2 to 1.8, for instance from 0.5 to 1.5. Often, x is approximately 1.0. For example, the compound may be a hybrid double perovskite compound of formula (Iza) or a layered hybrid double perovskite compound of formula (IIza):

$$[A]_2[B^I]_{0.5}Pb[B^{III}]_{0.5}[X]_6 \qquad (Iza);$$

$$[A]_4[B^I]_{0.5}Pb[B^{III}]_{0.5}[X]_8 \qquad (IIza);$$

wherein [A] is the one or more first monocations; $[B^I]$ is the one or more second monocations; $[B^{III}]$ is the one or more trications; and [X] is the one or more halide anions. The semiconducting material may comprise one or more secondary compounds in addition to the compound described above (e.g. in addition to the double halide perovskite of formula (I)). Examples of secondary compounds which the semiconducting material may further comprise include a perovskite of formula $[J][K][L]_3$ wherein: [J] is at least one monocation (which may be as defined herein for the first monocation A); [K] is at least one metal or metalloid dication (which may for instance be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$); and [L] is at least one halide anion; or a hexahalometallate of formula $[J]_2[M][L]_6$ wherein: [A] is at least one monocation (which may be as defined herein for the first monocation A); [M] is at least one metal or metalloid tetracation (which may for instance be selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$); and [L] is at least one halide anion. For instance, the secondary compound may be $MAPbI_3$.

The semiconductor device may be an optoelectronic device (for instance photovoltaic device, a solar cell, a photo detector, a photomultiplier, a photoresistor, a charge injection laser, a photodiode, a photosensor, a chromogenic device, a light-sensitive transistor, a phototransistor, a light-emitting device or a light-emitting diode), a transistor, a solid state triode, a battery, a battery electrode, a capacitor or a super-capacitor.

Typically, the semiconductor device is an optoelectronic device. Preferably, the semiconductor device is a photovoltaic device, a light-emitting device (for instance a light emitting diode) or a photodetector. Most preferably, the semiconductor device is a photovoltaic device. When the semiconductor device is an optoelectronic device, the semiconducting material is typically a photoactive material. In some cases, the semiconducting material is a photoemissive material.

The semiconducting material may comprise greater than or equal to 50 wt % of the compound (e.g. the double perovskite compound). The semiconducting material may comprise additional components. In particular, the semiconducting material may comprise one or more dopant compounds. Typically, the semiconducting material comprises greater than or equal to 80 wt % of the compound (e.g. a double perovskite compound as defined herein). Preferably, the semiconducting material comprises greater than or equal to 95 wt % of the compound as defined herein (e.g. a double perovskite compound), for instance greater than or equal to 99 wt % of the compound as defined herein (e.g. a double perovskite compound as defined herein). The semiconducting material may consist, or consist essentially, of the compound.

The semiconducting material is typically solid. Typically, the semiconducting material comprises crystalline material. The semiconducting material may be crystalline or poly crystalline. For instance the semiconducting material may comprise a plurality of crystallites of the compound.

The semiconducting material may be in any form. Typically the semiconducting material is in the form of a layer, for instance a photoactive, photoemissive or photoabsorbent, material in the form of a layer. The semiconducting material typically comprises a layer of the compound. The semiconducting material may consist essentially of a layer of the compound, for instance a layer of a double perovskite compound as defined herein. The semiconductor device may comprise a layer of said semiconducting material (for instance a photoactive material) having a thickness of greater than or equal to 50 nm, or having a thickness of greater than or equal to 100 nm.

Typically, the semiconductor device comprises a layer of the semiconducting material, which layer preferably has a thickness of from 5 nm to 1000 nm. Preferably, the layer of the semiconducting material has a thickness of from 100 nm to 700 nm, for instance from 200 nm to 500 nm. The layer of the semiconducting material may consist, or consist essentially of a layer of the compound having a thickness of from 100 nm to 700 nm. For instance, the semiconductor device may comprise a layer of said semiconducting material, which semiconducting material comprises a double perovskite compound as defined herein, which layer has a thickness of greater than or equal to 100 nm. In some devices, the layer may be a thin sensitising layer, for instance having a thickness of from 5 nm to 50 nm. In devices wherein the layer of said semiconducting material forms a planar heterojunction with an n-type or p-type region, the layer of said photoactive material may have a thickness of greater than or equal to 100 nm. Preferably, the layer of said photoactive material has a thickness of from 100 nm to 700 nm, for instance from 200 nm to 500 nm. The term "planar heterojunction", as used herein, means that surface defining junction between the semiconducting material and the n- or p-type region is substantially planar and has a low roughness, for instance a root mean squared roughness of less than 20 nm over an area of 25 nm by 25 nm, for instance a root mean squared roughness of less than 10 nm, or less than 5 nm, over an area of 25 nm by 25 nm.

The semiconducting material often acts as a photoactive component (e.g. a photoabsorbent component or a photoemissive component) within the semiconductor device. The semiconducting material may alternatively act as a p-type semiconductor component, an n-type semiconductor component, or an intrinsic semiconductor component in the semiconductor device. For instance, the semiconducting material may form a layer of a p-type, n-type or intrinsic semiconductor in a transistor, e.g. a field effect transistor. For instance, the semiconducting material may form a layer of a p-type or n-type semiconductor in an optoelectronic device, e.g. a solar cell or an LED.

Typically, the semiconductor device comprises:
an n-type region comprising at least one n-type layer;
a p-type region comprising at least one p-type layer; and, disposed between the n-type region and the p-type region:
a layer of said semiconducting material.

For instance, the semiconductor device is often an optoelectronic device, which optoelectronic device comprises:
an n-type region comprising at least one n-type layer;
a p-type region comprising at least one p-type layer; and, disposed between the n-type region and the p-type region:
said layer of a semiconducting material which comprises (or consists essentially of) a layer of said compound (e.g. a double perovskite compound as defined herein).

The n-type region comprises at least one n-type layer. The n-type region typically comprises one or two n-type layers. Each layer may be porous or compact. A compact layer is typically a layer without open porosity (e.g. absent of any meso- or macroporosity). The p-type region comprises at least one p-type layer. The p-type region typically comprises one or two p-type layers. Each layer may be porous or compact. A compact layer is typically a layer without open porosity.

In some cases, the semiconductor device comprises a layer of said semiconducting material without open porosity. The layer of said semiconducting material without open porosity is typically a layer of a perovskite compound according to the invention without open porosity. Thus, the layer of said semiconducting material may comprise greater than or equal to 95 volume % of the semiconducting material (and thus less than 5 volume % of absence pore volume). As described above, a layer without open porosity is a layer which typically does not comprise macropores or mesopores.

The layer of the semiconducting material typically forms a planar heterojunction with the n-type region or the p-type region. The layer of the semiconducting material typically forms a first planar heterojunction with the n-type region and a second planar heterojunction with the p-type region. This forms a planar heterojunction device. The term "planar heterojunction" as used herein refers to a junction between two regions where one region does not infiltrate the other. This does not require that the junction is completely smooth, just that one region does not substantially infiltrate pores in the other region.

When the layer of the semiconducting material forms a planar heterojunction with both the p-type and the n-type region, this typically forms a thin film device. The thickness of the layer of the semiconducting material may be greater than or equal to 50 nm. Preferably, the thickness of the layer of the semiconducting material is greater than or equal to 100 nm, for instance from 100 nm to 700 nm.

In some embodiments, it is desirable to have a porous scaffold material present. The layer of a porous scaffold is usually in contact with a compact layer of a semiconductor material, for instance an n-type compact layer or a p-type compact layer. The layer of a porous scaffold is usually also in contact with the semiconducting material. The scaffold material is typically mesoporous or macroporous. The scaffold material may aid charge transport from the semiconducting material to an adjacent region. The scaffold material may also, or alternatively, aid formation of the layer of the semiconducting material during device construction. The porous scaffold material is typically infiltrated by the semiconducting material.

Thus, in some embodiments, the semiconductor device comprises:
an n-type region comprising at least one n-type layer;
a p-type region comprising at least one p-type layer; and, disposed between the n-type region and the p-type region:
(i) a porous scaffold material; and
(ii) said semiconducting material in contact with the scaffold material.

The semiconducting material in contact with the porous scaffold material may form a sensitizing layer of the semiconducting material. Thus, the semiconducting device may be a halide double perovskite-sensitized device.

Typically, the semiconducting material in the first layer is disposed in pores of the scaffold material. The scaffold material is typically mesoporous. The scaffold material may be macroporous.

Typically, the porous scaffold material comprises a dielectric material or a charge-transporting material. The scaffold material may be a dielectric scaffold material. The scaffold material may be a charge-transporting scaffold material. The porous scaffold material may be an electron-transporting material or a hole-transporting scaffold material, n-type semiconducting materials are examples of electron-transporting materials, p-type semiconductors are examples of hole-transporting scaffold materials. Preferably, the porous scaffold material is a dielectric scaffold material or an electron-transporting scaffold material (e.g. an n-type scaffold material).

The porous scaffold material may be a charge-transporting scaffold material (e.g. an electron-transporting material such as titania, or alternatively a hole transporting material) or a dielectric material, such as alumina. The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.) The skilled person of course is readily able to measure the band gap of a semiconductor (including that of a double perovskite compound) by using well-known procedures which do not require undue experimentation. For instance, the band gap of a semiconductor can be estimated by constructing a photovoltaic diode or solar cell from the semiconductor and determining the photovoltaic action spectrum as described above. Alternatively the band gap can be estimated by measuring the light absorption spectra either via transmission spectrophotometry or by photo thermal deflection spectroscopy. The band gap can be determined by making a Tauc plot, as described in Tauc, I, Grigorovici, R. & Vancu, a. Optical Properties and Electronic Structure of Amorphous Germanium. Phys. Status Solidi 15, 627-637 (1966) where the square of the product of absorption coefficient times photon energy is plotted on the Y-axis against photon energy on the x-axis with the straight line intercept of the absorption edge with the x-axis giving the optical band gap of the semiconductor.

The porous scaffold material typically comprises an n-type semiconductor or a dielectric material. For instance, the device may comprise a layer of said porous scaffold material, where the porous scaffold material comprises an n-type semiconductor.

The porous scaffold is typically in the form of a layer. For instance, the porous scaffold may be a layer of porous scaffold material, typically having a thickness of from 5 nm to 500 nm, for instance from 10 nm to 200 nm.

In some embodiments, the semiconductor device comprises:
- an n-type region comprising at least one n-type layer;
- a p-type region comprising at least one p-type layer; and, disposed between the n-type region and the p-type region:
  (i) a first layer which comprises a porous scaffold material and said semiconducting material; and
  (ii) a capping layer disposed on said first layer, which capping layer is a layer of said semiconducting material without open porosity,
  wherein the semiconducting material in the capping layer is in contact with the semiconducting material in the first layer.

The first layer comprises said porous scaffold material and said semiconducting material disposed on the surface of the scaffold material. The term "scaffold material" as used herein refers to a material whose function(s) include acting as a physical support for another material. In the present case, the scaffold material acts as a support for the semiconducting material present in the first layer. The semiconducting material is disposed, or supported on, the surface of the scaffold material. The porous scaffold material typically has an open porous structure. Accordingly, the "surface" of the porous scaffold material here typically refers to the surfaces of pores within the scaffold material. Thus, the semiconducting material in the first layer is typically disposed on the surfaces of pores within the scaffold material.

In some embodiments, the scaffold material is porous and the semiconducting material in the first layer is disposed in pores of the scaffold material. The effective porosity of said scaffold material is usually at least 50%. For instance, the effective porosity may be about 70%. In one embodiment, the effective porosity is at least 60%, for instance at least 70%.

Typically, the semiconducting material (or photoactive material) in the first layer contacts one of the p-type and n-type regions, and the semiconducting material in the capping layer contacts the other of the p-type and n-type regions. The semiconducting material in the capping layer typically forms a planar heterojunction with the p-type region or the n-type region.

In one embodiment, the semiconducting material in the capping layer contacts the p-type region, and the semiconducting material in the first layer contacts the n-type region. In another embodiment, the semiconducting material in the capping layer contacts the n-type region, and the semiconducting material in the first layer contacts the p-type region (for instance in an inverted device).

In one embodiment, the semiconducting material in the capping layer contacts the p-type region, and the semiconducting material in the first layer contacts the n-type region. Usually, in this embodiment, the scaffold material is either an electron-transporting scaffold material or a dielectric scaffold material. Typically, the semiconducting material in the capping layer forms a planar heterojunction with the p-type region.

In another embodiment, however, the semiconducting material in the capping layer contacts the n-type region, and the semiconducting material in the first layer contacts the p-type region. Typically, in this embodiment, the scaffold material is a hole-transporting scaffold material or a dielectric scaffold material. Typically, the semiconducting material in the capping layer forms a planar heterojunction with the n-type region.

The thickness of the capping layer is usually greater than the thickness of the first layer. The majority of any photoactivity (e.g. light absorption or light emission) therefore usually occurs in a capping layer.

The thickness of the capping layer is typically from 10 nm to 100 µm. More typically, the thickness of the capping layer is from 10 nm to 10 µm. Preferably, the thickness of the capping layer is from 50 nm to 1000 nm, or for instance from 100 nm to 700 nm. The thickness of the capping layer may be greater than or equal to 100 nm.

The thickness of the first layer, on the other hand, is often from 5 nm to 1000 nm. More typically, it is from 5 nm to 500 nm, or for instance from 30 nm to 200 nm.

The n-type region is typically an n-type layer. The n-type region may alternatively comprise an n-type layer and an n-type exciton blocking layer. Such an n-type exciton blocking layer is typically disposed between the n-type layer and the layer(s) comprising the semiconducting material. The n-type region may have a thickness of from 50 nm to 1000 nm. For instance, the n-type region may have a thickness of from 50 nm to 500 nm, or from 100 nm to 500 nm.

Preferably, the n-type region comprises a compact layer of an n-type semiconductor. The n-type region may further comprise a porous layer of an n-type semiconductor which may be the porous scaffold material as described above (wherein the porous scaffold material is an electron-transporting material).

The n-type region in the optoelectronic device of the invention comprises one or more n-type layers. Often, the n-type region is an n-type layer, i.e. a single n-type layer. In other embodiments, however, the n-type region may comprise an n-type layer and an n-type exciton blocking layer. In cases where an n-type exciton blocking layer is employed, the n-type exciton blocking layer is usually disposed between the n-type layer and the layer(s) comprising the semiconducting material.

An exciton blocking layer is a material which is of wider band gap than the semiconducting material, but has either its conduction band or valance band closely matched with those of the semiconducting material. If the conduction band (or lowest unoccupied molecular orbital energy levels) of the exciton blocking layer are closely aligned with the conduction band of the semiconducting material, then electrons can pass from the semiconducting material into and through the exciton blocking layer, or through the exciton blocking layer and into the semiconducting material, and we term this an n-type exciton blocking layer. An example of such is bathocuproine, as described in P. Peumans, A. Yakimov, and S. R. Forrest, "Small molecular weight organic thin-film photodetectors and solar cells" J. Appl. Phys. 93, 3693 (2001) and Masaya Hirade, and Chihaya Adachi, "Small molecular organic photovoltaic cells with exciton blocking layer at anode interface for improved device performance" Appl. Phys. Lett. 99, 153302 (2011)}.

An n-type layer is a layer of an electron-transporting (i.e. an n-type) material. The n-type material may, for instance, be a single n-type compound or elemental material, which may be undoped or doped with one or more dopant elements.

The n-type layer employed in the optoelectronic device of the invention may comprise an inorganic or an organic n-type material.

A suitable inorganic n-type material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

The n-type material may be selected from a metal oxide, a metal sulphide, a metal selenide, a metal telluride, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

More typically, the n-type material is selected from a metal oxide, a metal sulphide, a metal selenide, and a metal telluride.

Thus, the n-type layer may comprise an inorganic material selected from oxide of titanium, tin, zinc, niobium, tantalum, tungsten, indium, gallium, neodymium, palladium, or cadmium, or an oxide of a mixture of two or more of said metals. For instance, the n-type layer may comprise $TiCh$, $SnCh$, $ZnO$, $MnOs$, $Ta_2O_5$, $WO_3$, $W_2O_5$, $InCb$, $Ga_2Cb$, $Nd_2O_3$, $PbO$, or $CdO$.

Other suitable n-type materials that may be employed include sulphides of cadmium, tin, copper, or zinc, including sulphides of a mixture of two or more of said metals. For instance, the sulphide may be $FeS_2$, CdS, ZnS, SnS, BiS, SbS, or $Cu_2ZnSnS_4$.

The n-type layer may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be CdTe.

The n-type layer may for instance comprise an inorganic material selected from oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals.

Examples of other semiconductors that may be suitable n-type materials, for instance if they are n-doped, include group IV elemental or compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

Typically, the n-type layer comprises $TiCh$.

When the n-type layer is an inorganic material, for instance $TiCh$ or any of the other materials listed above, it may be a compact layer of said inorganic material. Preferably the n-type layer is a compact layer of $TiCh$.

Other n-type materials may also be employed, including organic and polymeric electron-transporting materials, and electrolytes. Suitable examples include, but are not limited to a fullerene or a fullerene derivative (for instance $C_{60}$ or Phenyl-C61-butyric acid methyl ester (PCBM)), an organic electron transporting material comprising perylene or a derivative thereof, or poly{[N,N0-bis(2-octyldodecyl)-naphthalene-1,4,5,8-bis(dicarboximide)-2,6-diyl]-alt-5,50-(2,20-bithiophene)} (P(NDI2OD-T2)).

The p-type region is typically a p-type layer. The p-type region may alternatively comprise an p-type layer and a p-type exciton blocking layer. Such a p-type exciton blocking layer is typically disposed between the p-type layer and the layer(s) comprising the semiconducting material. The p-type region may have a thickness of from 50 nm to 1000 nm. For instance, the p-type region may have a thickness of from 50 nm to 500 nm, or from 100 nm to 500 nm.

The p-type region in the semiconductor device of the invention comprises one or more p-type layers. Often, the p-type region is a p-type layer, i.e. a single p-type layer. In other embodiments, however, the p-type region may comprise a p-type layer and a p-type exciton blocking layer. In cases where a p-type exciton blocking layer is employed, the p-type exciton blocking layer is usually disposed between the p-type layer and the layer(s) comprising the semiconducting material. If the valence band (or highest occupied molecular orbital energy levels) of the exciton blocking layer is closely aligned with the valence band of the semiconducting material, then holes can pass from the semiconducting material into and through the exciton blocking layer, or through the exciton blocking layer and into the semiconducting material, and we term this a p-type exciton blocking layer. An example of such is tris[4-(5-phenylthiophen-2-yl)phenyl]amine, as described in Masaya Hirade, and Chihaya Adachi, "Small molecular organic photovoltaic cells with exciton blocking layer at anode interface for improved device performance" Appl. Phys. Lett. 99, 153302 (2011).

A p-type layer is a layer of a hole-transporting (i.e. a p-type) material. The p-type material may be a single p-type compound or elemental material, or a mixture of two or more p-type compounds or elemental materials, which may be undoped or doped with one or more dopant elements.

The p-type layer employed in the optoelectronic device of the invention may comprise an inorganic or an organic p-type material. Typically, the p-type region comprises a layer of an organic p-type material.

Suitable p-type materials may be selected from polymeric or molecular hole transporters. The p-type layer employed in the optoelectronic device of the invention may for instance comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). The p-type region may comprise carbon nanotubes. Usually, the p-type material is selected from spiro-OMeTAD, P3HT, PCPDTBT and PVK. Preferably, the p-type layer employed in the optoelectronic device of the invention comprises spiro-OMeTAD.

The p-type layer may for example comprise spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly [2,1,3-benzothiadiazole-4,7-diyl[4,4-bis (2-ethylhexyl)-4H-cyclopenta[2,1-b:3,4-b']dithiophene-2,6-diyl]]), or PVK (poly(N-vinylcarbazole)).

Suitable p-type materials also include molecular hole transporters, polymeric hole transporters and copolymer hole transporters. The p-type material may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, the p-type layer employed in the optoelectronic device of the invention may for instance comprise any of the aforementioned molecular hole transporting materials, polymers or copolymers.

Suitable p-type materials also include m-MTDATA (4,4', 4"-tris(methylphenylphenylamino)triphenylamine), MeOTPD (N,N,N',N'-tetrakis(4-methoxyphenyl)-benzidine), BP2T (5,5'-di(biphenyl-4-yl)-2,2'-bithiophene), Di-NPB (N,N'-Di-[(1-naphthyl)-N,N'-diphenyl]-1,1'-biphenyl)-4,4'-diamine), α-NPB (N,N'-di(naphthalen-1-yl)-N,N'-diphenyl-benzidine), TNATA (4,4',4"-tris-(N-(naphthylen-2-yl)-N-phenylamine)triphenylamine), BPAPF (9,9-bis[4-(N, N-bis-biphenyl-4-yl-amino)phenyl]-9H-fluorene), spiro-NPB (N2,N7-Di-1-naphthalenyl-N2,N7-diphenyl-9,9'-spirobi[9H-fluorene]-2,7-diamine), 4P-TPD (4,4-bis-(N,N'-diphenylamino)-tetraphenyl). PEDOT:PSS and spiro-OMeTAD.

The p-type layer may be doped, for instance with tertbutyl pyridine and LiTFSI. The p-type layer may be doped to increase the hole-density. The p-type layer may for instance be doped with $NOBF_4$ (Nitrosonium tetrafluoroborate), to increase the hole-density.

In other embodiments, the p-type layer may comprise an inorganic hole transporter. For instance, the p-type layer may comprise an inorganic hole transporter comprising an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may be a compact layer of said inorganic hole transporter.

The p-type layer may for instance comprise an inorganic hole transporter comprising an oxide of nickel, vanadium, copper or molybdenum; CuI, CuBr, CuSCN, $Cu_2O$, CuO or CIS; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may for instance comprise an inorganic hole transporter selected from CuI, CuBr, CuSCN, $Cu_2O$, CuO and CIS. The p-type layer may be a compact layer of said inorganic hole transporter.

Typically, the p-type layer comprises a polymeric or molecular hole transporter, and the n-type layer comprises an inorganic n-type material. The p-type polymeric or molecular hole transporter may be any suitable polymeric or molecular hole transporter, for instance any of those listed above. Likewise, the inorganic n-type material may be any suitable n-type inorganic, for instance any of those listed above. In one embodiment, for instance, the p-type layer comprises spiro-OMeTAD and the n-type layer comprises TiCh. Typically, in that embodiment, the n-type layer which comprises TiCh is a compact layer of TiCh. In other embodiments, both the n-type layer and the p-type layer comprise inorganic materials. Thus, the n-type layer may comprise an inorganic n-type material and the p-type layer may comprise an inorganic p-type material. The inorganic p-type material may be any suitable p-type inorganic, for instance any of those listed above. Likewise, the inorganic n-type material may be any suitable n-type inorganic, for instance any of those listed above. In other embodiments, the p-type layer comprises an inorganic p-type material (i.e. an inorganic hole transporter) and the n-type layer comprises a polymeric or molecular hole transporter. The inorganic p-type material may be any suitable p-type inorganic, for instance any of those listed above. Likewise, the n-type polymeric or molecular hole transporter may be any suitable n-type polymeric or molecular hole transporter, for instance any of those listed above.

For instance, the p-type layer may comprise an inorganic hole transporter and the n-type layer may comprise an electron transporting material, wherein the electron transporting material comprises a fullerene or a fullerene derivative, an electrolyte, or an organic electron transporting material, preferably wherein the organic electron transporting material comprises perylene or a derivative thereof, or poly {[N,N0-bis(2-octyldodecyl)-naphthalene-1,4,5,8-bis (dicarboximide)-2,6-diyl]-alt-5,50-(2,20-bithiophene)} (P(NDI2OD-T2)). The inorganic hole transporter may for instance comprise an oxide of nickel, vanadium, copper or molybdenum; CuI, CuBr, CuSCN, $Cu_2O$, CuO or CIS; aperovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. More typically, the inorganic hole transporter comprises an oxide of nickel, vanadium, copper or molybdenum; CuI, CuBr, CuSCN, $Cu_2O$, CuO or CIS; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. Thus, the inorganic hole transporter may comprise an oxide of nickel, vanadium, copper or molybdenum; CuI, CuBr, CuSCN, $Cu_2O$, CuO or CIS.

The semiconductor device typically further comprises one or more first electrodes and one or more second electrodes. The one or more first electrodes are typically in contact with the n-type region, if such a region is present. The one or more second electrodes are typically in contact with the p-type region, if such a region is present. Typically: the one or more first electrodes are in contact with the n-type region and the one or more second electrodes are in contact with the p-type region; or the one or more first electrodes are in contact with the p-type region and the one or more second electrodes are in contact with the n-type region.

The first and second electrode may comprise any suitable electrically conductive material. The first electrode typically comprises a transparent conducting oxide. The second electrode typically comprises one or more metals. Typically, the first electrode typically comprises a transparent conducting oxide and the second electrode typically comprises one or more metals.

The transparent conducting oxide may be as defined above and is often FTO, ITO, or AZO, and typically ITO.

The metal may be any metal. Generally the second electrode comprises a metal selected from silver, gold, copper, aluminium, platinum, palladium, or tungsten. The electrodes may form a single layer or may be patterned.

A semiconductor device according to the invention, for instance a sensitized solar cell, may comprise the following layers in the following order:
I. one or more first electrodes as defined herein;
II. optionally a compact n-type layer as defined herein;
III. a porous layer of an n-type material as defined herein;
IV. a layer of said semiconducting material (e.g. as a sensitizer);
V. a p-type region as defined herein;
VI. optionally a further compact p-type layer as defined herein; and
VII. one or more second electrodes as defined herein.

A semiconductor device according to the invention which is a photovoltaic device may comprise the following layers in the following order:
I. one or more first electrodes as defined herein;
II. an n-type region comprising at least one n-type layer as defined herein;
III. a layer of the semiconducting material comprising the compound as defined herein;
IV. a p-type region comprising at least one p-type layer as defined herein; and
V. one or more second electrodes as defined herein.

A photovoltaic device according to the invention may comprise the following layers in the following order:
I. one or more first electrodes which comprise a transparent conducting oxide, preferably FTO;
II. an n-type region comprising at least one n-type layer as defined herein;
III. a layer of the semiconducting material as defined herein;
IV. a p-type region comprising at least one p-type layer as defined herein; and
V. one or more second electrodes which comprise a metal, preferably silver or gold.

A photovoltaic device (for instance an inverted device) according to the invention may comprise the following layers in the following order:
I. one or more second electrodes as defined herein;
II. an n-type region comprising at least one n-type layer as defined herein;
III. a layer of the semiconducting material as defined herein;
IV. a p-type region comprising at least one p-type layer as defined herein; and
V. one or more first electrodes as defined herein.

A photovoltaic device according to the invention, for instance a sensitized solar cell, may comprise the following layers in the following order
I. one or more second electrodes which comprises a metal;
II. an n-type region comprising at least one mesoporous n-type layer as defined herein;
III. a sensitising layer of the semiconducting material as defined herein;
IV. a p-type region comprising at least one p-type layer as defined herein; and
V. one or more first electrodes which comprise a transparent conducting oxide.

The one or more first electrodes may have a thickness of from 100 nm to 700 nm, for instance of from 100 nm to 400 nm. The one or more second electrodes may have a thickness of from 10 nm to 500 nm, for instance from 50 nm to 200 nm or from 10 nm to 50 nm. The n-type region may have a thickness of from 50 nm to 500 nm. The p-type region may have a thickness of from 50 nm to 500 nm.

Process for Producing a Semiconductor Device

The invention also provides a process for producing a semiconductor device comprising a semiconducting material, wherein the semiconducting material comprises a compound comprising: (i) one or more first monocations [A]; (ii) one or more second monocations [$B^I$]; (iii) one or more trications [$B^{III}$]; and (iv) one or more halide anions [X], which process comprises: (a) disposing a second region on a first region, which second region comprises a layer of said semiconducting material. The semiconducting material may be as further defined herein. For instance, the semiconducting material may comprise a double perovskite as defined herein, for instance a double perovskite of formula (I) or formula (Ia) above.

The second region may be disposed by vapour deposition. Thus, (i) disposing a second region on a first region may comprise:
(Ai) exposing the first region to vapour, which vapour comprises said semiconducting material or one or more reactants for producing said semiconducting material; and
(Aii) allowing deposition of the vapour onto the first region to produce a layer of said semiconducting material thereon.

The vapour deposition process generally further comprises producing the vapour in the first place by evaporating said semiconducting material or evaporating said one or more reactants for producing said semiconducting material. In this step the semiconducting material or the one or more reactants for producing the semiconducting material are typically transferred to an evaporation chamber which is subsequently evacuated. The semiconducting material or the one or more reactants for producing the semiconducting material are typically then heated to produce a resulting vapour.

The resulting vapour is then exposed to and thereby deposited on the first region, to produce a solid layer of said semiconducting material thereon. If reactants are used, these may react together in situ to produce the semiconducting material on the first region.

Typically, the vapour deposition is allowed to continue until the layer of semiconducting material has a desired thickness, for instance a thickness of from 10 nm to 100 μm, or more typically from 10 nm to 10 μm. Preferably, the vapour deposition is allowed to continue until the layer of semiconducting material has a thickness of from 50 nm to 1000 nm, or for instance from 100 nm to 700 nm. For instance, deposition may be continued until approximately 100 nm to 300 nm of the powder is deposited onto the first region.

The vapour deposition may continue until the layer of the semiconducting material has a thickness of at least 100 nm. Typically, for instance, it continues until the solid layer of the semiconducting material has a thickness of from 100 nm to 100 μm, or for instance from 100 nm to 700 nm.

In one embodiment, the step disposing the second region on the first region comprises:
(i) exposing the first region to vapour, which vapour comprises one or more first precursor compounds, one or more second precursor compounds and one or more third precursor compounds; and
(ii) allowing deposition of the vapour onto the first region, to produce a layer of said semiconducting material thereon;

wherein (i) further comprises producing said vapour comprising one or more first precursor compounds, one or more second precursor compounds and one or more third precursor compounds by evaporating the one or more first precursor compounds and one or more second precursor compounds from a first source and evaporating one or more third precursor compounds from a second source. The one or more first precursor compounds, one or more second precursor compounds and one or more third precursor compounds may be as defined herein. The two sources are typically placed at the same distance from the first region, often from 10 to 40 cm.

The second region may instead be disposed by solution processing. Thus, (i) disposing a second region on a first region may comprise:
- (Bi) disposing one or more precursor compositions on the first region, which one or more precursor compositions comprise: said semiconducting material and one or more solvents; or one or more reactants for producing said semiconducting material and one or more solvents; and
- (Bii) removing the one or more solvents to produce on the first region a layer of said semiconducting material.

Said semiconducting material may be as defined herein. Thus, the semiconducting material is often a photoactive material, for instance a photoabsorbent material or a photoemissive material. The one or more precursor compositions may comprise said semiconducting material as defined herein and one or more solvents.

The one or more reactants for producing said semiconducting material may be as defined below. The one or more solvents may be any suitable solvents. Typically the one or more solvents are selected from polar solvents. Examples of polar solvents include water, alcohol solvents (such as methanol, ethanol, n-propanol, isopropanol and n-butanol), ether solvents (such as dimethylether, diethylether and tetrahydrofuran), ester solvents (such as ethyl acetate), carboxylic acid solvents (such as formic acid and ethanoic acid), ketone solvents (such as acetone), amide solvents (such as dimethylformamide and diethylformamide), amine solvents (such as triethylamine), nitrile solvents (such as acetonitrile), sulfoxide solvents (dimethylsulfoxide) and halogenated solvents (such as dichloromethane, chloroform, and chlorobenzene). The one or more solvents may be selected from polar aprotic solvents. Examples of protic apolar solvents include dimethylformamide (DMF), acetonitrile and dimethylsulfoxide (DMSO). Preferably the one or more solvents are a single polar solvent, for instance DMF, DMSO, ethanol or isopropanol.

Usually, the steps of (Bi) disposing a precursor solution on the first region, and (Bii) removing the solvent, comprise spin-coating or slot-dye-coating the precursor solution or solutions onto the first region, to produce on the first region a layer of the semiconducting material. Said coating may be carried out in an inert atmosphere, for instance under nitrogen, or it may be carried out in air. The spin-coating is usually performed at a speed of from 1000 to 3000 rpm. The spin coating is typically carried out for 30 seconds to 2 minutes.

Typically, (Bi) comprises disposing a solution of a first precursor compound (for instance methylammonium iodide), a second precursor compound (for instance silver iodide) and a third precursor compound (for instance bismuth triiodide) in a polar solvent by spin-coating. (Bi) may, for instance, comprise disposing a solution of the perovskite compound in a polar solvent by spin-coating. The solution of the perovskite compound in a polar solvent may be produced by dissolving powder of the perovskite compound in the polar solvent.

The precursor solution or solutions may be disposed by spin-coating onto the first region to produce on the first region said layer of the semiconducting material.

The steps of disposing the precursor solution or solutions on the first region and removing the solvent or solvents are carried out until the layer of the semiconducting material has a desired thickness, for instance a thickness of from 10 nm to 100 μm, more typically from 10 nm to 10 μm. The thickness of the layer of the semiconducting material may be as described above.

For instance, the steps of disposing the precursor solution or solutions on the first region and removing the solvent or solvents may be carried out until the layer of the semiconducting material has a thickness of from 50 nm to 1000 nm, or for instance from 100 nm to 700 nm.

The layer of the semiconducting material may have a thickness of greater than or equal to 100 nm.

Removing the one or more solvents typically comprises heating the one or more solvents or allowing the one or more solvents to evaporate. The substrate, solvent or first region may be heated at a temperature of from 40° C. to 100° C. for a time of from 5 minutes to 2 hours to remove the one or more solvents.

The one or more reactants for producing the semiconducting material typically comprise one or more first precursor compounds, one or more second precursor compounds and one or more third precursor compounds,
which one or more first precursor compounds are selected from compounds of formula [A][X];
which one or more second precursor compounds are selected from compounds of formula $[B_I][X]$; and
which one or more second precursor compounds are selected from compounds of formula $[B^{III}][X]_3$;
wherein [A] is the one or more first monocations; $[B^I]$ is the one or more second monocations; $[B^{III}]$ is the one or more trications; and each [X] is the one or more halide anions. [A], $[B^I]$, $[B^{III}]$ and [X] each may be as defined herein.

Typically, the one or more first precursor compounds are selected from $(CH_3NH_3)I$, $(CH_3NH_3)Br$, $(CH_3NH_3)Cl$, $(CH_3NH_3)F$, $(H_2N-C(H)=NH_2)I$, $(H_2N-C(H)=NH_2)Br$, $(H_2N-C(N)=NH_2)Cl$, $(H_2N-C(N)=NH_2)F$, $(H_2N-C(NH_2)=NH_2)I$, $(H_2N-C(NH_2)=NH_2)Br$, $(H_2N-C(NH_2)=NH_2)Cl$, $(H_2N-C(NH_2)=NH_2)F$, CsI, CsBr, CsCl and CsF. Preferably, the one or more first precursor compounds are selected from $(CH_3NH_3)I$, $(CH_3NH_3)Br$, $(H_2N-C(H)=NH_2)I$ and $(H_2N-C(H)=NH_2)Br$, more preferably selected from $(CH_3NH_3)I$ and $(H_2N-C(H)=NH_2)I$.

Typically, the one or more second precursor compounds are selected from compounds of formula AgI, AgBr, AgCl, AgF, AuI, AuBr, AuCl, AuF, CuI, CuBr, CuCl and CuF. Preferably, the one or more second precursor compounds are selected from compounds of formula AgI, AgBr, AuI, AuBr, CuI and CuBr, more preferably selected from AgI and AuI.

Typically, the one or more second precursor compounds are selected from compounds of formula $BiI_3$, $BiBr_3$, $BiCl_3$, $BiF_3$, $SbI_3$, $SbBr_3$, $SbCl_3$ and $SbF_3$. Preferably, the one or more second precursor compounds are selected from compounds of formula $BiI_3$, $BiBr_3$, $SbI_3$ and $SbBr_3$, more preferably selected from $BiI_3$ and $SbI_3$.

For instance the first precursor compound may be $(CH_3NH_3)I$, $(CH_3NH_3)Br$, $(H_2N-C(H)=NH_2)I$ or $(H_2N-C(H)=NH_2)Br$, the second precursor compound may be AgI, AgBr, AuI, AuBr, CuI or CuBr, and the third precursor compound may be $BiI_3$, $BiBr_3$, $SbI_3$ or $SbBr_3$.

After the second region is deposited, the process may further comprise a step of annealing the second region. For instance, the second region may be heated to a temperature of from 50° C. to 200° C., or from 70° C. to 150° C. The second region may be heated to a temperature of from 90° C. to 110° C. The second region may be heated for a time from 30 seconds to 60 minutes, for instance from 2 minutes to 25 minutes.

Typically, the process further comprises (b) disposing a third region on the second region, wherein: said first region is an n-type region comprising at least one n-type layer and said third region is a p-type region comprising at least one p-type layer; or said first region is a p-type region comprising at least one p-type layer and said third region is an n-type region comprising at least one n-type layer.

The third region is typically a p-type region comprising at least one p-type layer, preferably wherein the at least one p-type layer comprises an organic p-type semiconductor. The p-type region may be as described above.

The third region is typically disposed on the second region until it has a thickness of from 50 nm to 1000 nm, for instance 100 nm to 500 nm. Disposing the third region on the second region typically comprises disposing a composition comprising a p-type material and a solvent on the second region (for instance by spin-coating) and removing the solvent. The p-type material may be any p-type material described herein. Preferably, said third region is a p-type region comprising at least one p-type layer, preferably wherein the at least one p-type layer comprises an organic p-type material, for instance spiro-OMeTAD.

The process typically further comprises: (c) disposing one or more second electrodes on the third region. The one or more second electrodes may be as defined above for an semiconductor device according to the invention. For instance, the second electrodes may comprise a metal such as silver. The one or more second electrodes are typically disposed by vacuum vapour deposition, for instance by evaporation at a low pressure (e.g less than or equal to $10^{-5}$ mbar) optionally through a shadow mask.

An exemplary process according to the invention may be as follows: (i) separately dissolve each of (1) MAX or FAX powder, (2) $BiX_3$ or $SbX_3$ powder and (3) AgX or AuI powder in a solvent, for instance DMF, at a concentration of from 10 wt % to 40 wt % where X is I, Br, Cl or F; (ii) agitate each solution until it fully dissolves (optionally including heating to from 50° C. to 120° C.); (iii) combine the three solutions to produce a precursor solution; (iv) provide a substrate (e.g. glass/FTO with titania or a microscope slide); (v) spin coat the precursor solution on the substrate; (vi) anneal at from 80° C. to 120° C. for from 1 min to 20 min; (vii) dispose a p-type layer, for instance spiro-OMeTAD, by spin-coating; and (vii) deposit metal, for instance silver, electrodes to form the device.

The invention also provides a semiconductor device obtainable by a process for producing a semiconductor device according to the invention.

Compound

The invention provides a compound comprising: (i) one or more first monocations [A]; (ii) one or more second monocations [$B^I$] selected from $Cu^+$, $Ag^+$ and $Au^+$; (iii) one or more trications [$B^{III}$]; and (iv) one or more halide anions [X]. The compound is typically crystalline. The compound may be poly crystalline. The compound is usually solid.

The invention also provides a composition comprising greater than 0.1% of the compound according to the invention by weight relative to the weight of the total composition. The composition may comprise greater than 1.0% by weight or greater than 5.0% by weight. The invention also provides a composition comprising greater than 10% by weight of the compound according to the invention. The composition may comprise greater than 50%, greater than 90% or greater than 95% by weight of the compound of the invention. The composition may consist, or consist essentially of, the compound of the invention.

The compound is typically a double perovskite compound of formula (I) or a layered double perovskite compound of formula (II):

$[A]_2[B^I][B^{III}][X]_6$ (I);

$[A]_4[B^I][B^{III}][X]_8$ (II);

wherein: [A] is the one or more first monocations; [$B^I$] is the one or more second monocations selected from $Cu^+$, $Ag^+$ and $Au^+$; [$B^{III}$] is the one or more trications; and [X] is the one or more halide anions.

The compound may be as further defined herein.

The compound may be $(H_2N-C(H)=NH_2)_2AgBiI_6$, $(H_2N-C(H)=NH_2)_2AuBiI_6$, $(H_2N-C(H)=NH_2)_2CuBiI_6$, $(H_2N-C(H)=NH_2)_2AgSbI_6$, $(H_2N-C(H)=NH_2)_2AuSbI_6$, $(H_2N-C(H)=NH_2)_2CuSbI_6$, $(H_2N-C(H)=NH_2)_2AgBiBr_6$, $(H_2N-C(H)=NH_2)_2AuBiBr_6$, $(H_2N-C(H)=NH_2)_2CuBiBr_6$, $(H_2N-C(H)=NH_2)_2AgSbBr_6$, $(H_2N-C(H)=NH_2)_2AuSbBr_6$, $(H_2N-C(H)=NH_2)_2CuSbBr_6$, $(H_2N-C(H)=NH_2)_2AgBiCl_6$, $(H_2N-C(H)=NH_2)_2AuBiCl_6$, $(H_2N-C(H)=NH_2)_2CuBiCl_6$, $(H_2N-C(H)=NH_2)_2AgSbCl_6$, $(H_2N-C(H)=NH_2)_2AuSbCl_6$, $(H_2N-C(H)=NH_2)_2CuSbCl_6$, $(H_2N-C(H)=NH_2)_2AgBiF_6$, $(H_2N-C(H)=NH_2)_2AuBiF_6$, $(H_2N-C(H)=NH_2)_2CuBiF_6$, $(H_2N-C(H)=NH_2)_2AgSbF_6$, $(H_2N-C(H)=NH_2)_2AuSbF_6$, $(H_2N-C(H)=NH_2)_2CuSbF_6$, $(CH_3NH_3)_2AgBiI_6$, $(CH_3NH_3)_2AuBiI_6$, $(CH_3NH_3)_2CuBiI_6$, $(CH_3NH_3)_2AgSbI_6$, $(CH_3NH_3)_2AuSbI_6$, $(CH_3NH_3)_2CuSbI_6$, $(CH_3NH_3)_2AgBiBr_6$, $(CH_3NH_3)_2AuBiBr_6$, $(CH_3NH_3)_2CuBiBr_6$, $(CH_3NH_3)_2AgSbBr_6$, $(CH_3NH_3)_2AuSbBr_6$, $(CH_3NH_3)_2CuSbBr_6$, $(CH_3NH_3)_2AgBiCl_6$, $(CH_3NH_3)_2AuBiCl_6$, $(CH_3NH_3)_2CuBiCl_6$, $(CH_3NH_3)_2AgSbCl_6$, $(CH_3NH_3)_2AuSbCl_6$, $(CH_3NH_3)_2CuSbCl_6$, $(CH_3NH_3)_2AgBiF_6$, $(CH_3NH_3)_2AuBiF_6$, $(CH_3NH_3)_2CuBiF_6$, $(CH_3NH_3)_2AgSbF_6$, $(CH_3NH_3)_2AuSbF_6$, $(CH_3NH_3)_2CuSbF_6$, $Cs_2AgBiI_6$, $Cs_2AuBiI_6$, $Cs_2CuBiI_6$, $Cs_2AgSbI_6$, $Cs_2AuSbI_6$, $Cs_2CuSbI_6$, $Cs_2AgBiBr_6$, $Cs_2AuBiBr_6$, $Cs_2CuBiBr_6$, $Cs_2AgSbBr_6$, $Cs_2AuSbBr_6$, $Cs_2CuSbBr_6$, $Cs_2AgBiCl_6$, $Cs_2AuBiCl_6$, $Cs_2CuBiCl_6$, $Cs_2AgSbCl_6$, $Cs_2AuSbCl_6$, $Cs_2CuSbCl_6$, $Cs_2AgBiF_6$, $Cs_2AuBiF_6$, $Cs_2CuBiF_6$, $Cs_2AgSbF_6$, $Cs_2AuSbF_6$ or $Cs_2CuSbF_6$.

The compound is preferably $(H_2N-C(H)=NH_2)_2AgBiI_6$, $(H_2N-C(H)=NH_2)_2AuBiI_6$, $(H_2N-C(H)=NH_2)_2AgBiBr_6$, $(H_2N-C(H)=NH_2)_2AuBiBr_6$, $(H_2N-C(H)=NH_2)_2AgSbI_6$, $(H_2N-C(H)=NH_2)_2AuSbI_6$, $(H_2N-C(H)=NH_2)_2AgSbBr_6$, $(H_2N-C(H)=NH_2)_2AuSbBr_6$, $(CH_3NH_3)_2AgBiI_6$, $(CH_3NH_3)_2AuBiI_6$, $(CH_3NH_3)_2AgBiBr_6$, $(CH_3NH_3)_2AuBiBr_6$, $(CH_3NH_3)_2AgSbI_6$, $(CH_3NH_3)_2AuSbI_6$, $(CH_3NH_3)_2AgSbBr_6$ or $(CH_3NH_3)_2AuSbBr_6$.

The compound is more preferably $(H_2N-C(H)=NH_2)_2AgBiI_6$, $(H_2N-C(H)=NH_2)_2AuBiI_6$, $(CH_3NH_3)_2AgBiI_6$ or $(CH_3NH_3)_2AuBiI_6$. Alternatively, the compound may be $Cs_2AgBiCl_6$.

The compounds of the invention may be synthesised by the following method comprising: (i) dissolving one or more first precursor compounds of formula [A][X]; one or more second precursor compounds of formula [$B^I$][X]; and one or more third precursor compounds of formula $[B^{III}][X]_3$; in a solvent; and (ii) removing the solvent (for instance by ambient evaporation or heating) to produce the compound, typically a double perovskite compound as defined herein; wherein [A] is the one or more first monocations; $[B^I]$ is the one or more second monocations; $[B^{III}]$ is the one or more trications; and each [X] is the one or more halide anions. [A], $[B^I]$, $[B^{III}]$ and [X] each may be as defined herein. The solvent may be as defined above and may, for instance, comprise dimethylformamide (DMF), acetonitrile or dimethylsulfoxide (DMSO). The precursor compounds and solvent may be heated in order to promote dissolution of the precursor compounds.

For example: a compound according to the invention may be synthesised by (i) separately dissolving each of (1) MAX or FAX powder, (2) $BiX_3$ or $SbX_3$ powder and (3) AgX or AuX (e.g. AuI) powder in a solvent, for instance DMF, each at a concentration of from 10 wt % to 40 wt % where X is I, Br, Cl or F; (ii) agitating each solution until it fully dissolves (optionally including heating to from 50° C. to 120° C.); (iii) combining the three solutions to produce a precursor solution; (iv) providing a substrate (e.g. glass/FTO with titania or a microscope slide); (v) spin coat the precursor solution on the substrate; and (vi) anneal at from 80° C. to 120° C. for from 1 min to 20 min.

Typically, the three precursor compounds are combined in a molar ratio of $B^IX:B^{III}X_3:AX$ of approximately 1:1:2. For instance, for each equivalent of B*X, there may be from 0.2 to 5.0 equivalents of $B^{III}X_3$, preferably from 0.5 to 2.0 equivalents of $B^{III}X_3$, and from 0.5 to 10.0 equivalents of AX, preferably from 1.0 to 3.0 equivalents of AX.

The compounds described herein may alternatively be synthesised by a solid state process.

The solid state process typically comprises combining solid forms of one or more first precursor compounds of formula [A][X]; one or more second precursor compounds of formula $[B^I][X]$; and one or more third precursor compounds of formula $[B^{III}][X]_3$; and (ii) heating the combined solid forms of the first, second and third precursor compounds to produce the compound, typically a double perovskite compound as defined herein. [A] is the one or more first monocations; $[B^I]$ is the one or more second monocations; $[B^{III}]$ is the one or more trications; and each [X] is the one or more halide anions. [A], $[B^I]$, $[B^{III}]$ and [X] each may be as defined herein. Typically, the one or more first precursor compounds are a single first precursor compound of formula AX; the one or more second precursor compounds are a single second precursor compound of formula $[B^I][X]$; and the one or more third precursor compounds are a single third precursor compound of formula $B^{III}X_3$. For instance, the first precursor compound may be CsX; the second precursor compound may be AgX or AuX; and the third precursor compound may be $SbX_3$ or $BiX_3$. Typically, the three precursor compounds are combined in a molar ratio of $B^IX:B^{III}X_3:AX$ of approximately 1:1:2. For instance, for each equivalent of $B^IX$, there may be from 0.2 to 5.0 equivalents of $B^{III}X_3$, preferably from 0.5 to 2.0 equivalents of $B^{III}X_3$, and from 0.5 to 10.0 equivalents of AX, preferably from 1.0 to 3.0 equivalents of AX.

Typically, the solid forms of the precursor compounds are powders of the precursor compounds. The solid forms of the precursor compounds are typically combined by mixing together powders of those compounds. The precursor compounds are typically combined in a sealed container (for instance a fused ampoule). The sealed container typically has a low interior pressure, for instance of less than or equal to $10^{-2}$ Torr. In some cases, the sealed container will be substantially free of oxygen, for instance having a partial pressure of less than or equal to $10^{-3}$ Torr of oxygen.

Heating the combined solid forms of the first, second and third precursor compounds is typically done by heating the combined solid forms to a temperature of greater than or equal to 100° C., for instance greater than or equal to 300° C. For instance, the combined solid forms may be heated to a temperature of from 300° C. to 800° C. Once heated, the combined solid forms may be held at the temperature to which they were heated for from 0.5 to 10 hours, for instance from 3 to 6 hours. Preferably, the combined solid forms are heated to from 400° C. to 600° C. and held at that temperature from 2 to 6 hours. After heating, the resultant composition is typically then cooled to ambient temperature (e.g. 25° C.). Crystallisation of the double perovskite compound is typically then observed. Thin films of the perovskite compound may then be produced by dissolving the obtained double perovskite compound in a solvent (for instance DMF) to form a solution, and spin-coating the solution on a substrate.

Removal of the solvent typically leads to formation of a thin film.

The invention will be described further by the following Examples.

EXAMPLES

Example 1—Computational Study

Computational Setup

Structural optimisations were performed using DFT/LDA calculations, planewaves, and pseudopotentials, as implemented in the Quantum ESPRESSO distribution. For Cu, Ag, Au, and C, N, H, we use ultrasoft pseudopotentials including nonlinear core correction. For Bi and Sb we use norm-conserving pseudopotentials as in (Filip et al, *quasiparticle band structures of stibnite, antimonselite, bismuthinite, and guanajuatite*. Phys. Rev. B 87, 205125, 2013). All pseudopotentials are from the Quantum ESPRESSO library for reproducibility. The planewaves kinetic energy cutoffs for the wavefunctions and charge density are set to 60/70 Ry and 300/350 Ry for Bi/Sb perovskites, respectively. The Brillouin zone is sampled using an unshifted 6×6×6 grid. Forces and total energies are converged to 10 meV/A and 1 meV. All structural optimisations were carried out using scalar-relativistic LDA, while the band structures were from fully-relativistic calculations. The eigenvalues of high-symmetry points were also calculated using the PBE0 functional in order to approximately correct for the band gap underestimation in DFT/LDA. This choice is potentially of limited accuracy but is expected to provide reliable band gap variations with respect to $MAPbI_3$. The PBE0 calculations are carried out using VASP, the projector-augmented wave method, and a kinetic energy cut-off of 37 Ry. In the shake-and-relax method we displace every atomic coordinate randomly by ±0.1 Å, and randomly modify each component of the direct lattice vectors by ±0.3 Å. For each structure repeat this procedure is repeated starting from 10 randomised configurations. As a cross-test we checked that $MAPbI_3$ correctly passes this test, while $LiPbI_3$ (which is know not to form in a perovskite structure) does not. The carrier effective masses are calculated using the relativistic DFT/LDA band structures, using a second-order finite-differences formula with increments of $4×10^{-3}$ Å$^{-1}$ in reciprocal space. The anisotropy ratio of the effective mass tensor is obtained as the norm of the traceless part of the tensor over the norm of the complete tensor (this ratio can be between 0 and 100%). The optical absorption spectrum is obtained as $\alpha(\omega)=\omega\epsilon_2(\omega)/cn(\omega)$, where $\omega$ is the photon frequency, c the speed of light, $\epsilon_2$ the imaginary part of the dielectric function, and n the refractive index. The dielectric function is calculated within the independent particle approximation, by taking the average over the light polarization vectors, using a dense 8×8×8 Brillouin zone grid. In the calculations of optical spectra the DFT/LDA band structures are used after applying a scissor correction to the conduction states in order to match the PBE0 band gaps.

Results of Computational Study

Hypothetical double perovskites derived from MAPbI$_3$ by replacing two Pb atoms with the pairs B$^I$/B$^{III}$ where B$^{III}$=Sb or Bi and B$^I$=Cu, Ag or Au were invesitigated. In particular, it was investigated what the optoelectronic properties of such double perovskites would be when adopting the same structure as MAPbI$_3$. Starting from the low-temperature orthorhombic structure of MAPbI$_3$, Pb was substituted for B$^I$/B$^{III}$ using a rock-salt ordering with B$^I$ and B$^{III}$ alternating in every direction. For each structure thus constructed standard structural optimization is performed using density-functional theory (DFT) in the local density approximation (LDA), including relativistic spin-orbit coupling effects throughout. In the band structure calculations the PBE0 functional was employed in order to bracket the band gaps.

Figure 2:
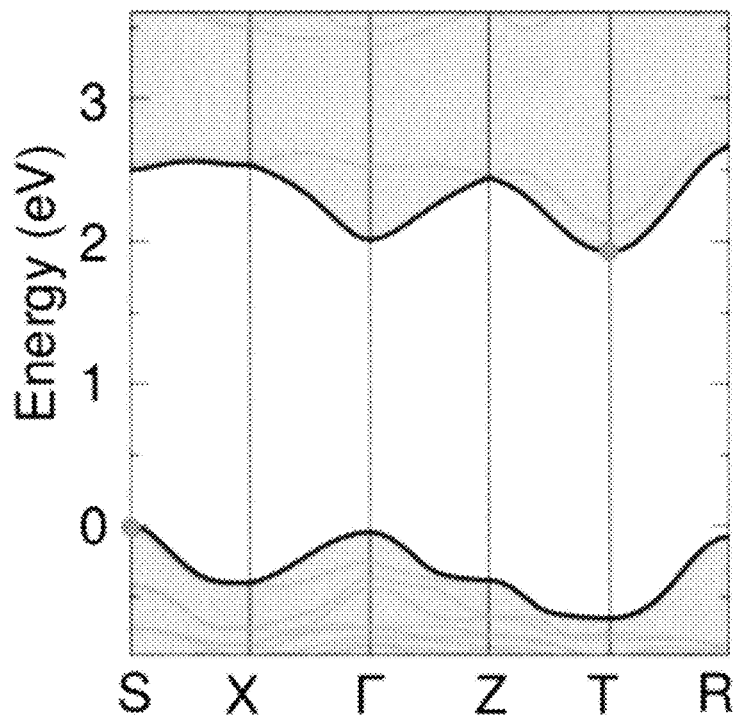
FIG. 2 shows DFT/LDA calculated electronic band structure of MA$_2$AgBiI$_6$, along high-symmetry lines in the Brillouin zone.
Figure 3:
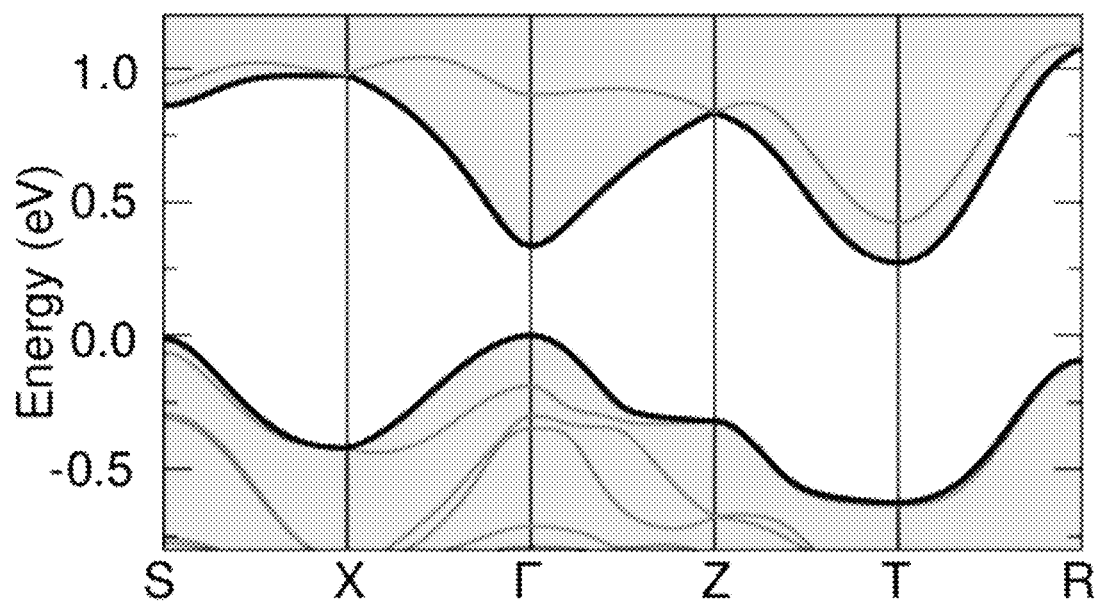
FIG. 3 shows DFT/LDA calculated electronic band structure of MA$_2$CuBiI$_6$, along high-symmetry lines in the Brillouin zone.
Figure 4:
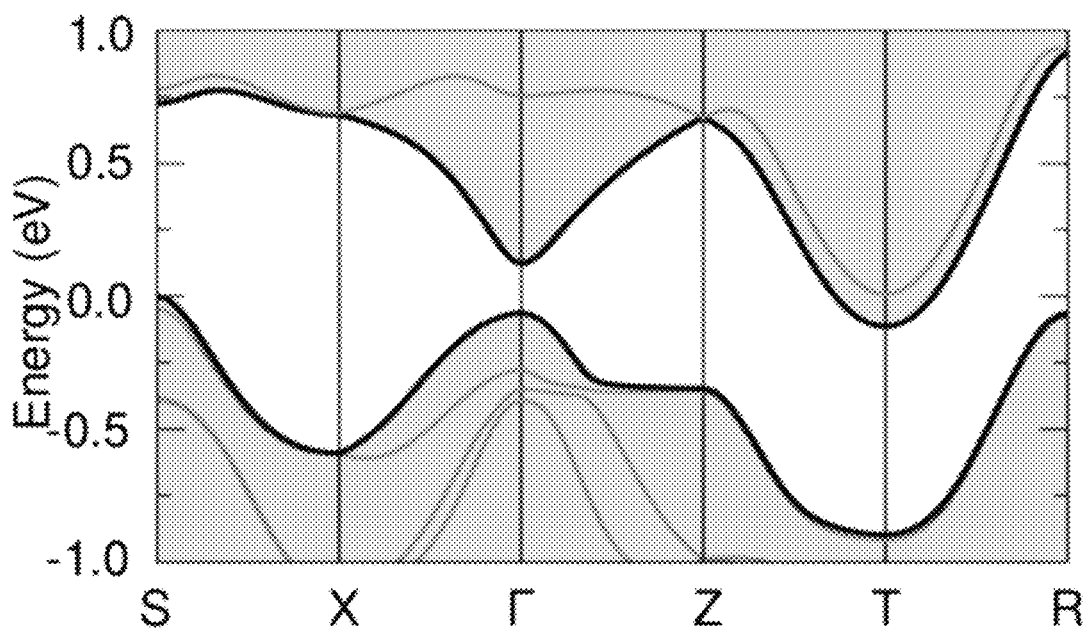
FIG. 4 shows DFT/LDA calculated electronic band structure of MA$_2$AuBiI$_6$, along high-symmetry lines in the Brillouin zone.

In the case of Bi-based hypothetical double perovskites, MA$_2$AgBiI$_6$ was as focused on as a representative example. FIG. 2 shows that the band structure of MA$_2$AgBiI$_6$ exhibits strongly dispersive band edges, with the valence and conduction band extrema at $\Gamma$ (wavevector k=0 in the Brillouin zone) of I-5p and of mixed Bi-6p and I-5p character, respectively. The dispersive profile and the p-character of the band edges at $\Gamma$ bear a close resemblance to the electronic structure of MAPbI$_3$. The band gap at $\Gamma$ (0.7/2.1 eV within FDA/PBE0) is also very similar to the value calculated for MAPbI$_3$ (0.4/1.7 eV; the experimental value is 1.7 eV). However, unlike in MAPbI$_3$, the top of the valence band is now at the S point [k=($\pi$/a; $\pi$/b; 0)], and the bottom of the conduction band is at the T point [k=(0; $\pi$/b; $\pi$/c)], where a=8.51 Å and b=8.04 Å and c=11.91 Å are the lattice parameters. By comparing the band structures of MAPbI$_3$ and MA$_2$AgBiI$_6$ in FIGS. 1 and 2 it is seen that the emergence of an indirect gap in the latter results from the folding of the Brillouin zone along the directions of alternation of Bi and Ag, whereby $\Gamma$ is mapped into the T and S points. As a result MA$_2$AgBiI$_6$ exhibits an indirect band gap only slightly below (0.15 eV) the direct gap at $\Gamma$. This unusual band structure could prove beneficial to solar cell performance, since the absorption onset and the maximum open-circuit voltage are similar to the case of MAPbI$_3$, but unlike MAPbI$_3$ the radiative recombination of photo-excited carriers is quenched. FIGS. 3 and 4 shows that the phenomenology just described for MA$_2$AgBiI$_6$ remains essentially unchanged for the Cu and Au perovskites MA$_2$CuBiI$_6$ and MA$_2$AuBiI$_6$, therefore each of these compounds exhibits an electronic structure which is promising for replacing lead in MAPbI$_3$.

Figure 5:
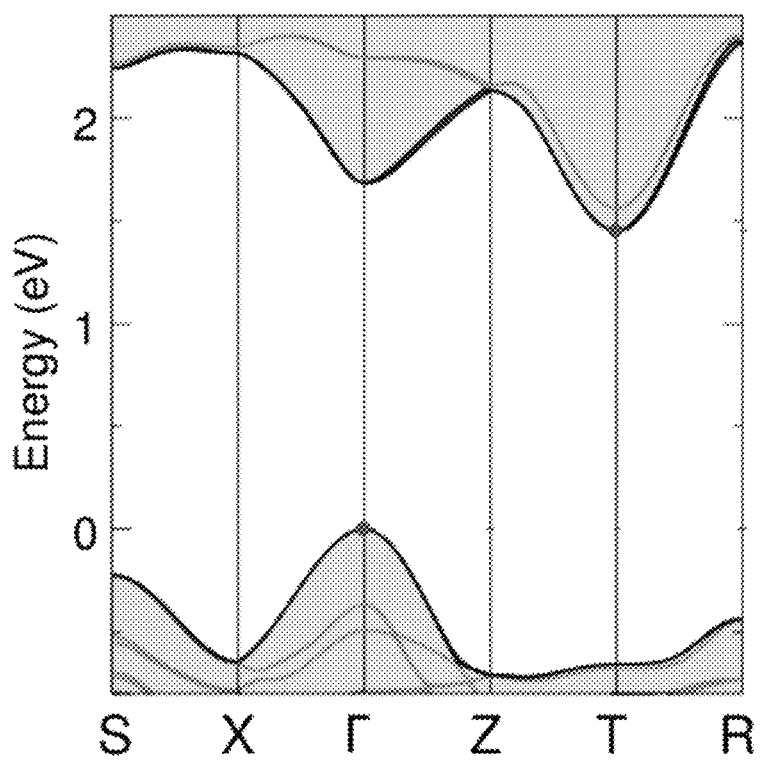
FIG. 5 shows DFT/LDA calculated electronic band structure of FA$_2$AgBiI$_6$, along high-symmetry lines in the Brillouin zone.

A formamidinium (FA) analogue of the double perovskite compounds discussed above was also investigated. This compound, FA$_2$AgBiI$_6$, has a fundamental band gap of 0.2/1.5 eV (LDA/PBE0) as shown in FIG. 5, which is 0.3 eV smaller than that found for MA$_2$AgBiI$_6$. The band gap of FA$_2$AgBiI$_6$ is remarkably close to the value calculated for MAPbI$_3$. Based on these results it is proposed that FA$_2$AgBiI$_6$ is also a promising candidate to achieve lead-free perovskite solar cells.

Figure 6:
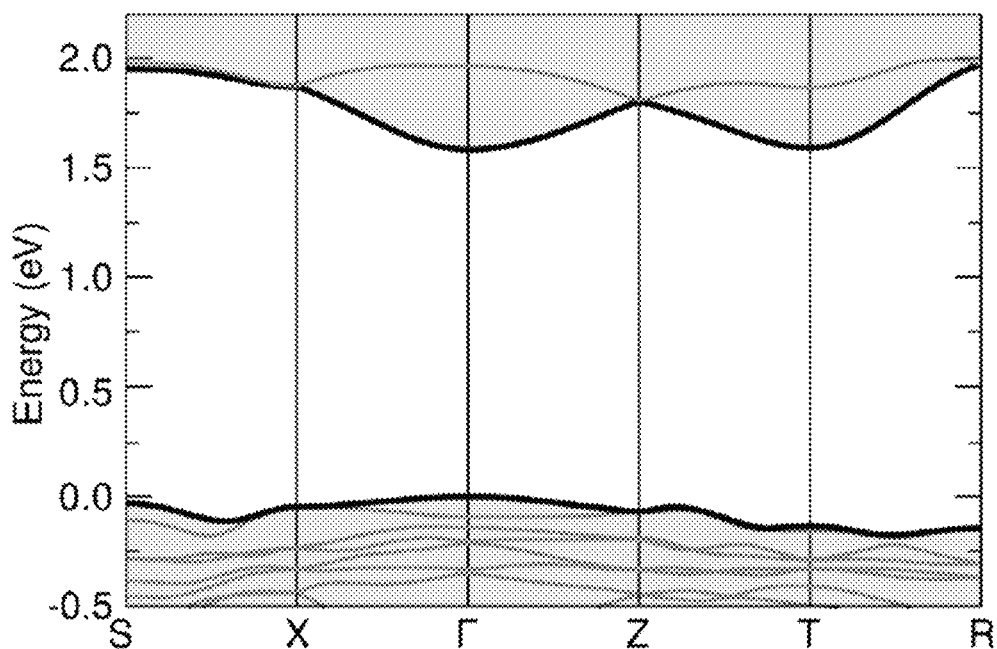
FIG. 6 shows DFT/LDA calculated electronic band structure of MA$_2$BiNaI$_6$, along high-symmetry lines in the Brillouin zone.

The electronic structure of a hypothetical MABi$_{0.5}$Na$_{0.5}$I$_3$ double perovskites was also calculated and is shown in FIG. 6. The structure of the compound is obtained from MAPbI$_3$ by replacing Pb with Bi and Na, arranged in the rock-salt ordering, and fully optimising the resulting structure within DFT/LDA. The band structure is reported along the same high-symmetry lines as in FIG. 1. The fundamental gap calculated in DFT/LDA is 1.6 eV. The hole effective mass along the T-X and T-Y direction is 9.5 m$_e$ and 5.6 m$_e$, respectively.

Thus, based on these computational studies, a range of halide double perovskite compounds are shown to be promising alternatives to lead-based perovskites.

Example 2—Synthesis of MA$_2$AgBiI$_6$

The organic-inorganic halide double perovskite methylammonium bismuth silver iodide (MA$_2$AgBiI$_6$) was synthesised by the following procedure.

Figure 7:
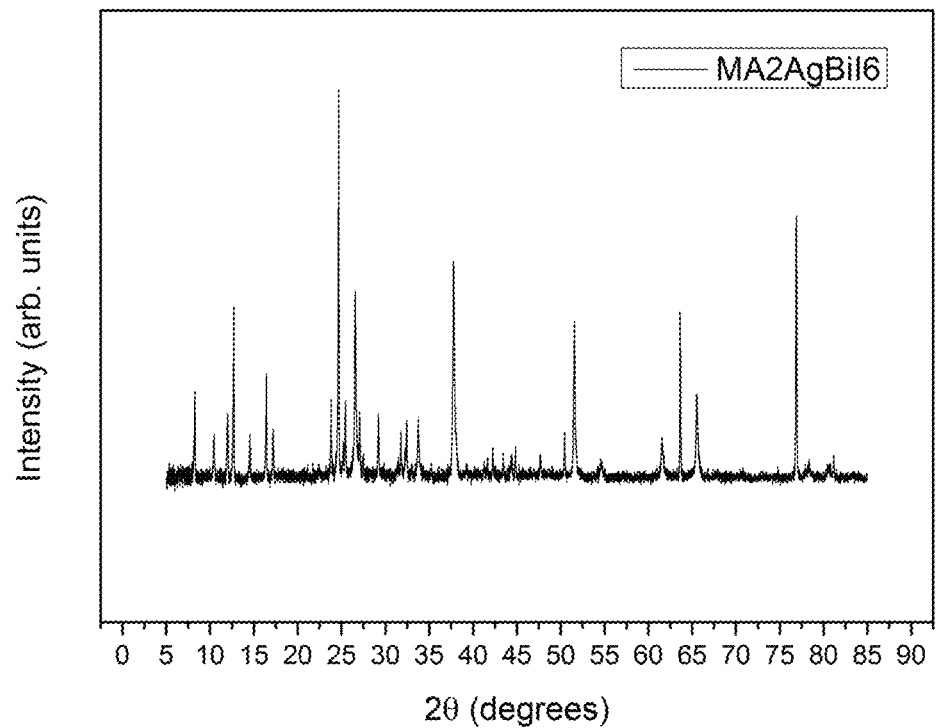
FIG. 7 shows the powder XRD diffraction pattern of MA$_2$AgBiI$_6$.

(CH$_3$NH$_3$)I (methylammonium iodide, MAI), BiI$_3$ and AgI were independently dissolved in dimethylformamide (DMF). In particular, 0.250 g of AgI, 0.628 g of BiI$_3$ and 0.338 g of MAI were each dissolved in a separate vial (a molar ratio of AgI:BiI$_3$:MAI of 1:1:2 was used). To completely dissolve BiI$_3$ and AgI in DMF the solutions in different vials were heated on a hot plate up to ~100 degrees centigrade while stirring. The three solutions of AgI, BiI$_3$ and MAI were mixed in a 15 ml vial. The mixed solution was left on the hot plate at 115 degrees centigrade for 15 minutes before it was filtered. This was deposited on a fluorine doped tin oxide (FTO) coated glass by spin coating at 2000 rpm for 30 seconds. After drying in air the films were cured at 120 degrees centigrade to remove the solvent for 20 minutes and subsequently cooled to room temperature. Smooth films were obtained. A powder x-ray diffraction pattern of the resulting solid MA$_2$AgBiI$_6$ was recorded on an X'Pert PRO from PANalytical equipped with a Cu X-ray tube (K$_{\alpha 1}$=1.54060 Å), a secondary graphite (002) monochromator and a position sensitive X'Celerator detector, and operated in Bragg-Brentano geometry. The results are shown in FIG. 7. The compound was found to have a monoclinic crystal structure with the cell parameters: a=13.2284 Å; b=6.3402 Å; c=11.5789 Å; $\alpha$=90.0000°; $\beta$=112.6570°; $\gamma$=90.0000°.

Figure 9:
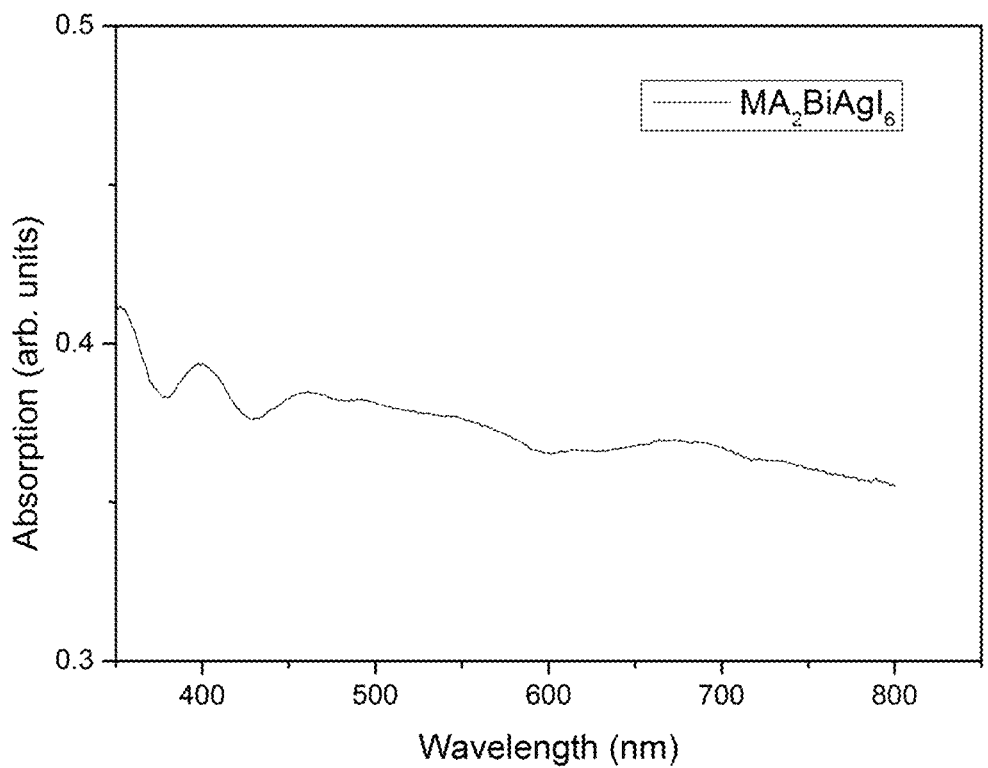
FIG. 9 shows the UV-Vis spectrum for MA$_2$AgBiI$_6$.

A UV-Vis spectrum for MA$_2$AgBiI$_6$ was also carried out using a Cary 300 UV-visible spectrophotometer in a photometric range of 200-850 nm and the result is shown in FIG. 9.

Example 3— Synthesis of FA$_2$AgBiI$_6$

The organic-inorganic halide double perovskite formamidinium bismuth silver iodide (FA$_2$AgBiI$_6$) was synthesised by the following procedure.

(H$_2$N—C(H)=NH$_2$)I (formamidinium iodide, FAI), BiI$_3$ and AgI were independently dissolved in dimethylformamide (DMF). In particular, 0.250 g of AgI, 0.628 g of BiI$_3$ and 0.366 g of FAI were each dissolved in a separate vial (a molar ratio of AgI:BiI$_3$: FAI 1:1:2 was used). To completely dissolve BiI$_3$ and AgI in DMF the solutions in different vials were heated on a hot plate up to ~100 degrees centigrade while stirring. A reddish solution formed upon mixing the three solutions of AgI, BiI$_3$ and FAI in a 15 ml vial. The mixed solution was left on the hot plate at 115 degrees centigrade for 15 minutes before it was filtered. This was deposited on a fluorine doped tin oxide (FTO) coated glass by spin coating at 2000 rpm for 30 seconds. After drying in air the films were cured at 120 degrees centigrade to remove the solvent for 20 minutes and subsequently cooled to room temperature. Smooth films with orange reddish colour were obtained.

Figure 8:
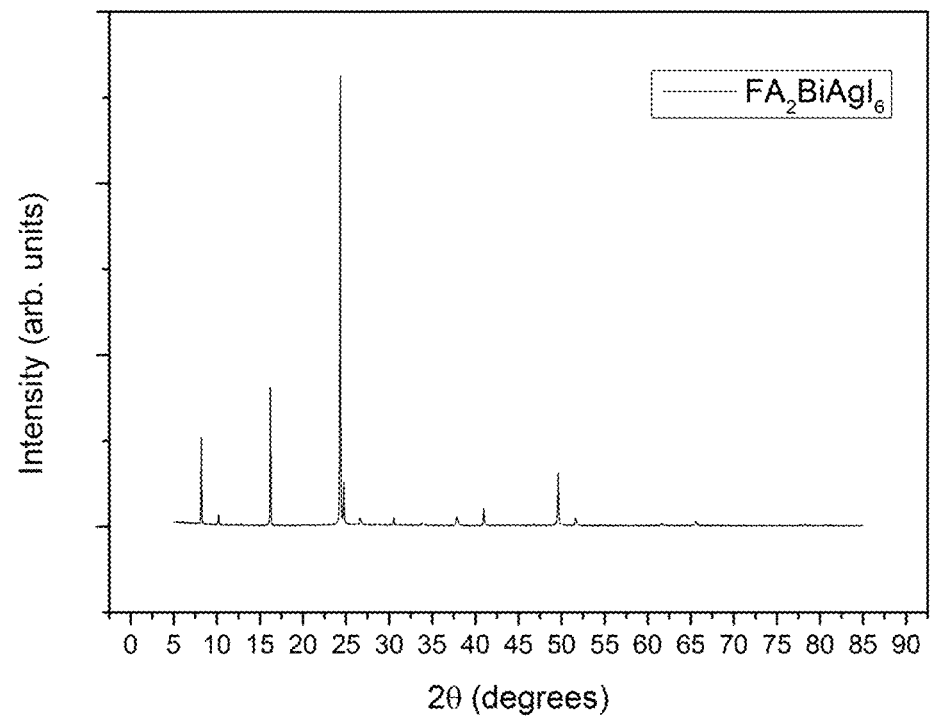
FIG. 8 shows the powder XRD diffraction pattern of FA$_2$AgBiI$_6$.

A powder x-ray diffraction pattern of the resulting solid $FA_2AgBiI_6$ was recorded on an X'Pert PRO from PANalytical equipped with a Cu X-ray tube ($K_{\alpha 1}$=1.54060 Å), a secondary graphite (002) monochromator and a position sensitive X'Celerator detector, and operated in Bragg-Brentano geometry. The results are shown in FIG. 8. The compound was found to have a cubic crystal structure with the cell parameters: a=b=c=10.781 Å; α=β=γ=90.0000°.

Figure 10:
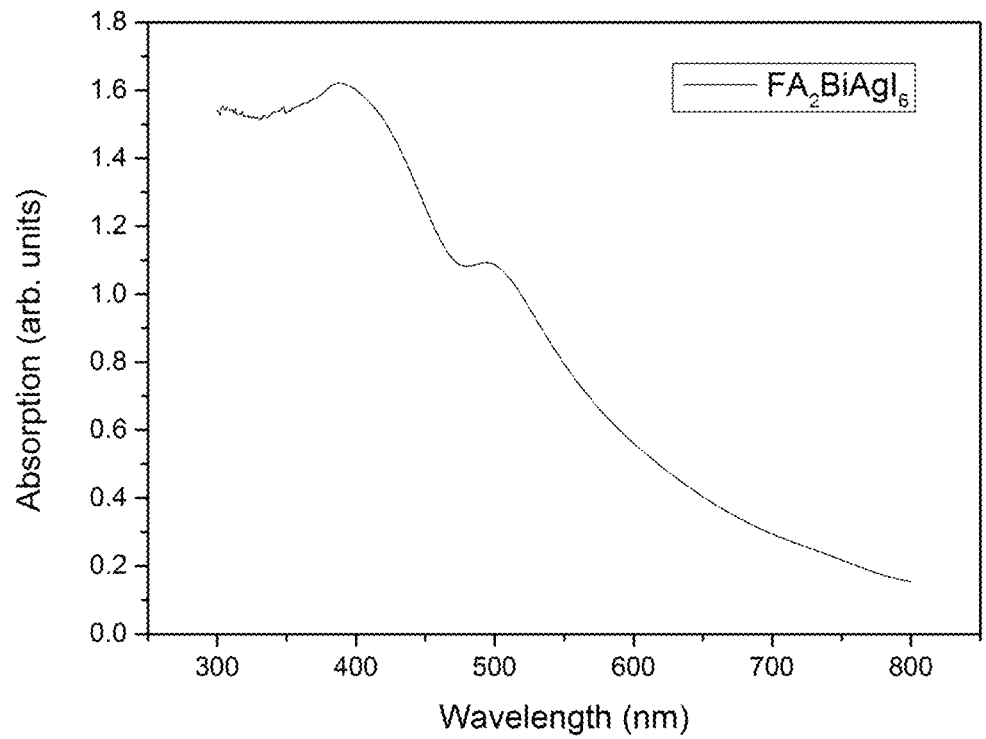
FIG. 10 shows the UV-Vis spectrum for FA$_2$AgBiI$_6$.

A UV-Vis spectrum for $FA_2AgBiI_6$ was also carried out using a Cary 300 UV-visible spectrophotometer in a photometric range of 200-850 nm and the result is shown in FIG. 10.

Example 4—Synthesis of $MA_2AuBiI_6$

The organic-inorganic halide double perovskite formamidinium bismuth gold iodide ($MA_2AuBiI_6$) was synthesised by the following procedure.

2 equivalent of methylammonium iodide ($CH_3NH_3I$, MAI), 1 equivalent of gold iodide (AuI) and 1 equivalent of bismuth triiodide ($BiI_3$) were dissolved in dimethylformamide (DMF). The resulting solution was spin-coated on to glass and the film was dried to produce a layer of $MA_2AuBiI_6$.

Figure 11:
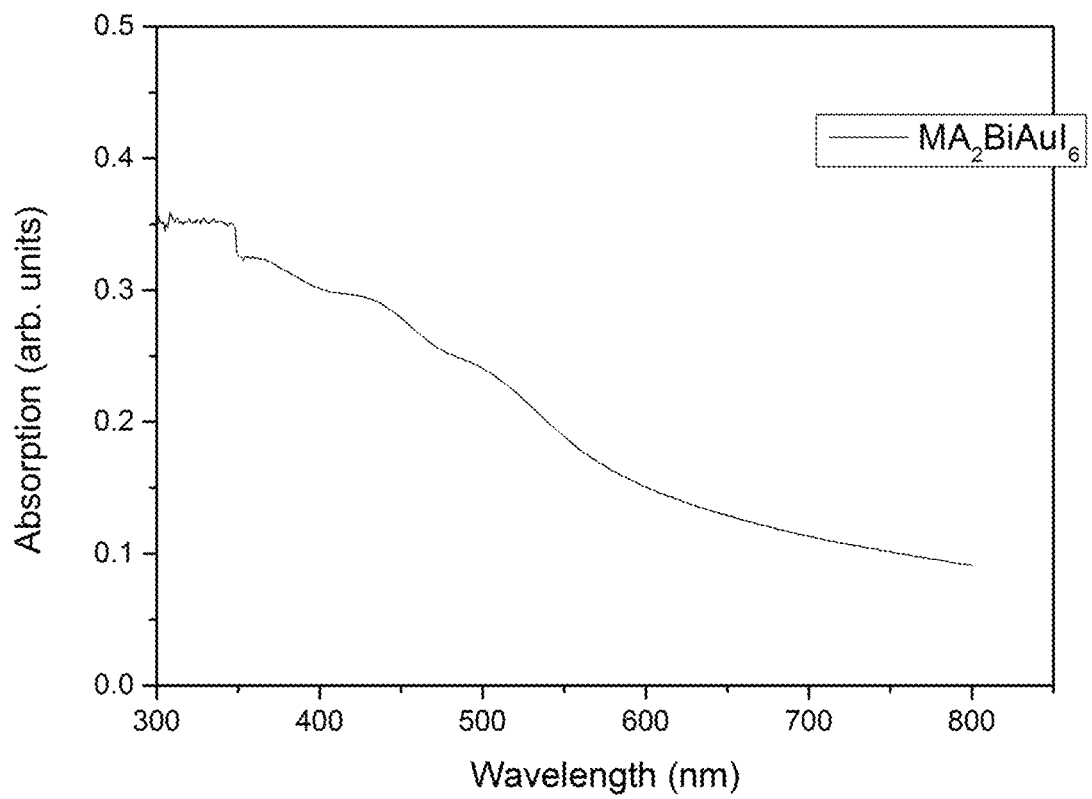
FIG. 11 shows the UV-Vis spectrum for MA$_2$AuBiI$_6$.

A UV-Vis spectrum for $MA_2AuBiI_6$ was also carried out using a Cary 300 UV-visible spectrophotometer in a photometric range of 200-850 nm and the result is shown in FIG. 11.

Example 5—Photoluminescence Measurements

Figure 12:
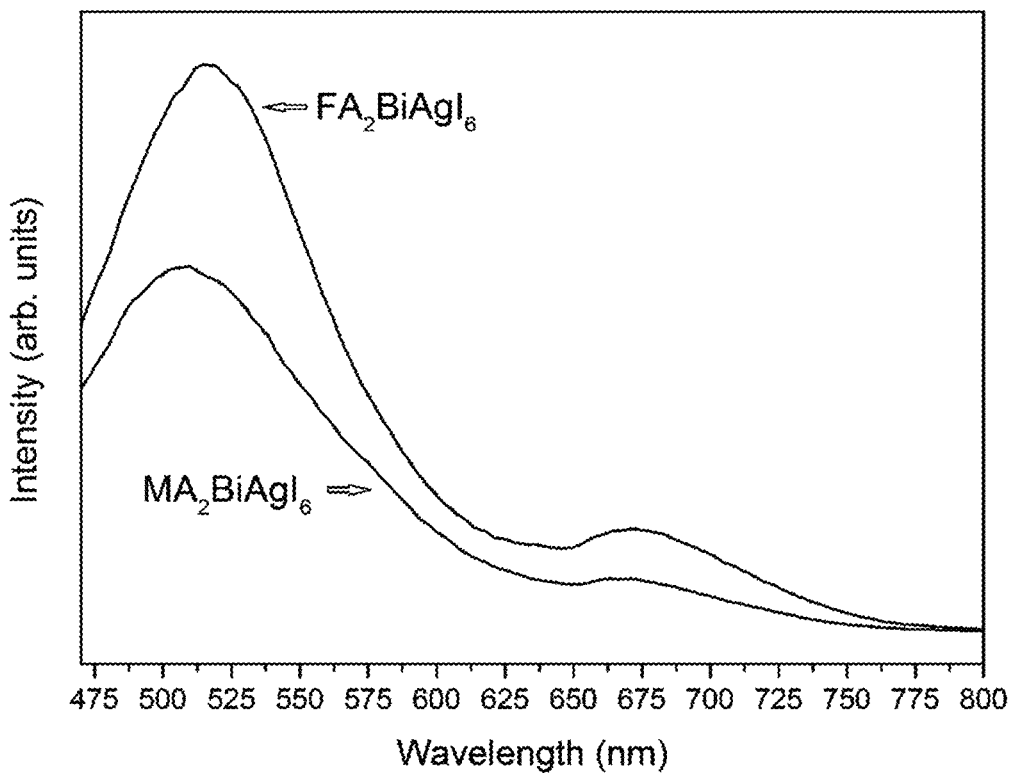
FIG. 12 shows photoluminescence spectra of MA$_2$AgBiI$_6$ and FA$_2$AgBiI$_6$.

Measurements of the photoluminescence emission spectra of $MA_2AgBiI_6$ and $FA_2AgBiI_6$ were done using a Fluorolog spectrometer with excitatation wavelength of 450 nm and measurements from 470 nm-800 nm with an integration time of 0.4 seconds. The results are shown in FIG. 12.

Example 6—Synthesis and Characterisation of $Cs_2BiAgCl_6$

Synthesis: Single-phase samples of $Cs_2BiAgCl_6$ were prepared by solid-state reaction in a sealed fused silica ampoule. For a typical reaction, the starting materials CsCl (Sigma Aldrich, 99.9%), BiCh (Sigma Aldrich, 99.99%) and AgCl (Sigma Aldrich, 99%) were mixed at a molar ratio of 2:1:1 respectively. The mixture was loaded in a fused silica ampoule that was flame sealed under vacuum ($10^{-3}$ Torr). The mixture was heated to 500° C. over 5 hours and held at 500° C. for 4 hours. After cooling to room temperature, a yellow poly crystalline material was formed. Octahedral shaped crystals of length 0.1 mm could be extracted from the powder sample, and these octahedral crystals were used to determine the crystal structure of the compound.

Film fabrication: $Cs_2BiAgCl_6$ powder was dispersed in poly methyl methacrylate (PMMA) in Toluene. To form films, the dispersion was spin-coated on a glass slide at 1500 rpm. This was repeated several times to attain a uniform thick film.

Structural characterization: Powder X-ray diffraction was carried out using a Panalytical X'pert powder diffractometer (Cu-Kα1 radiation; λ=154.05 μm) at room temperature. Structural parameters were obtained by Rietveld refinement using General Structural Analysis Software. Single crystal data were collected for $Cs_2BiAgCl_6$ at room temperature using an Agilent Supernova diffractometer that uses Mo Kα beam with λ=71.073 μm and is fitted with an Atlas detector. Data integration and cell refinement were performed using CrysAlis Pro Software by Agilent Technogies Ltd, Yamton, Oxfordshire, England. The structure was analysed by Patterson and Direct methods and refined using the SHELXL 2014 software package.

Film characterization: A Varian Cary 300 UV-Vis spectrophotometer with an integrating sphere was used to acquire absorbance spectra and to account for reflection and scattering. Time-resolved photo-luminescence measurements were acquired using a time correlated single photon counting (TCSPC) setup (FluoTime 300, PicoQuant GmbH). Film samples were photoexcited using a 397 nm laser head (LDH P-C-405, PicoQuant GmbH) pulsed at frequencies of 200 kHz. The steady-state photoluminescence (PL) measurements were taken using an automated spectrflouorometer (Fluorolog, Horiba Jobin-Yvon), with a 450 W-Xenon lamp excitation.

Figure 13:
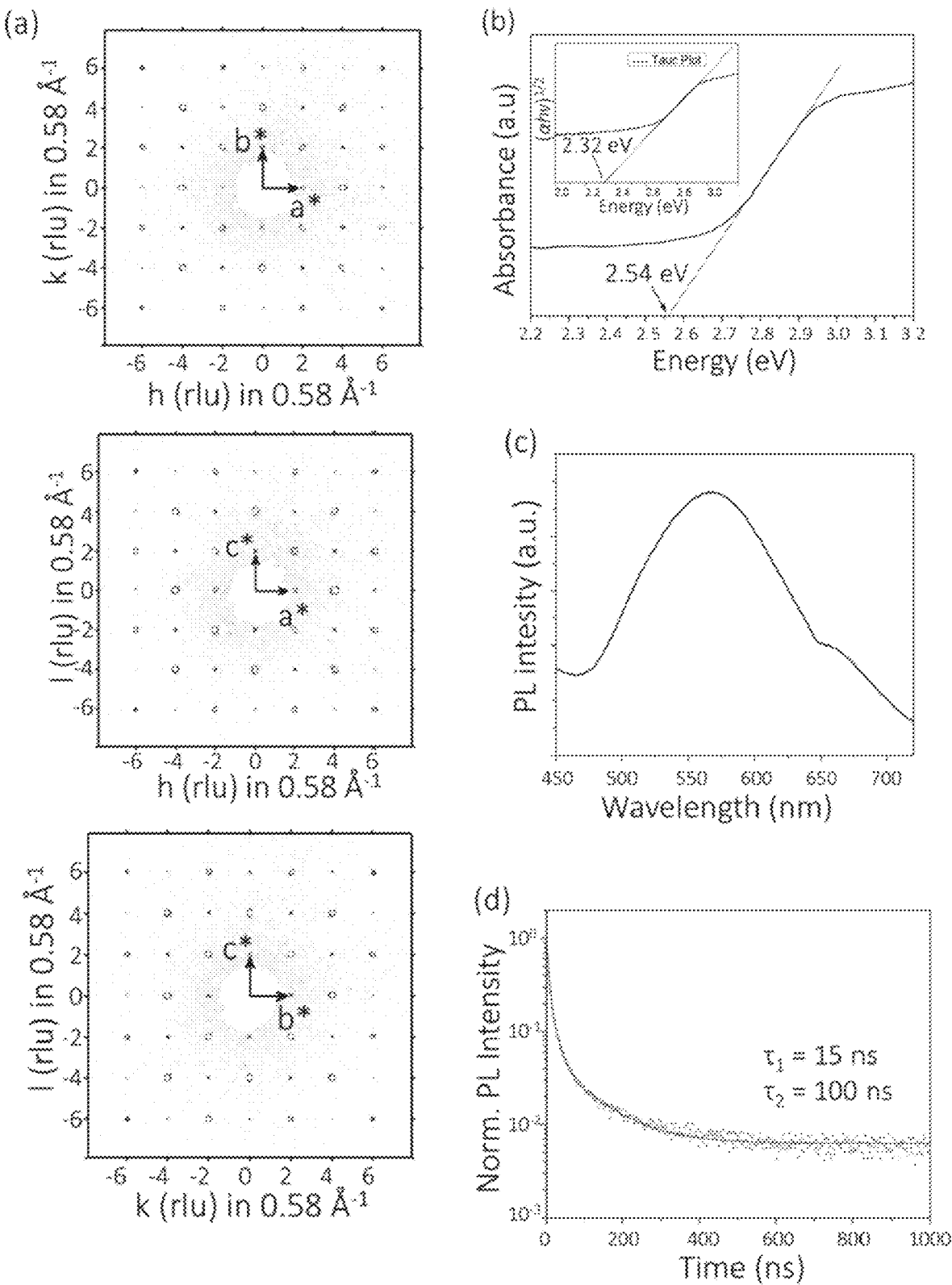
FIG. 13 shows the results of characterisation of Cs$_2$BiAgCl$_6$: (a) shows single crystal diffraction patterns along three different planes, 0kl, h0l and hk0; (b) shows the UV-Vis optical absorption spectrum; (c) shows the steady-state photoluminescence (PL) spectrum; and (d) shows time resolved photoluminescence decay.

The results of the single crystal analysis are shown in Table 1 below. FIG. 13 shows characterisation results for $Cs_2BiAgCl_6$. FIG. 13 (*a*) shows X-ray diffraction pattern for a $Cs_2BiAgCl_6$ single crystal at 293 K. hkl is shown for three different planes, i.e. 0kl, h0l and hk0. All wave vectors are labelled in reciprocal lattice units (rlu) and a*, b* and c* denote reciprocal lattice vectors of the cubic cell of the Fm3m structure. FIG. 13 (*b*) shows the UV-Vis optical absorption spectrum of $Cs_2BiAgCl_6$. The inset shows the Tauc plot, corresponding to an indirect allowed transition. The straight lines are fitted to the linear regions of the absorption spectrum and Tauc plot, and the intercepts at 2.32 eV and 2.54 eV marked on the plot are calculated from the fit. FIG. 13 (*c*) shows the steady-state photoluminescence (PL) spectrum of $Cs_2BiAgCl_6$ deposited on glass. Finally, FIG. 13 (*d*) shows the time resolved photoluminescence decay of $Cs_2BiAgCl_6$ deposited on glass. The data is fitted using a biexponential decay function. The decay lifetimes of 15 ns (fast) and 100 ns (slow) is estimated from the fit.

The X-ray Diffraction Pattern in FIG. 13 (*a*) is shown for a single crystal (~30 μm diameter). Sharp reflections are observed for the crystallographic 0kl, h0l and hk0 planes. These reflections show characteristics of m3m symmetry that reveal systematic absences for (hkl; h+k, k+l, h+l=2n) corresponding to the face-centered space groups F432, F43m and Fm3m. The latter was selected for structure refinement after confirmation that $Cs_2BiAgCl_6$ crystallizes in an FCC lattice. It was found that there is no significant distortion of octahedral symmetry about the $Bi^{3+}$. The X-ray diffraction patterns uniquely identify the Fm3m (no. 225) space group at room temperature, and the quantitative structural analysis gives a very good description of the data. In addition, the crystal structure refinement is consistent with the rock-salt configuration assumed by the atomistic model. The experimental and computationally predicted conventional lattice parameters are in very good agreement, 10.78 Å and 10.50 Å, respectively. From the optical absorption spectrum and Tauc plot (see FIG. 13 (*b*)) an indirect optical band gap in the range of 2.3-2.5 eV was estimated. The indirect character of the band gap is consistent with the broad photoluminescence peak observed between 480 and 650 nm (1.9-2.6 eV) with the maximum at ~575 nm (2.2 eV), red-shifted with respect to the optical absorption onset. In addition, the time-resolved photoluminescence decay shown in FIG. 13 (*c*) was fitted with a double exponential giving a fast component lifetime of 15 ns and a slow component lifetime of 100 ns.

TABLE 1 single crystal data for $Cs_2BiAgCl_6$

| Compound | $Cs_2BiAgCl_6$ |
| --- | --- |
| Measurement temperature | 293 K |
| Crystal system | Cubic |
| Space group | Fm$\bar{3}$m |
| Unit cell dimensions | a = 10.777 ± 0.005 Å |
| | $\alpha = \beta = \gamma = 90°$ |
| Volume | 1251.68 Å$^3$ |
| Z | 4 |
| Density (calculated) | 4.221 g/cm$^3$ |
| Reflections collected | 3434 |
| Unique reflections | 82 from which 0 suppressed |
| R(int) | 0.1109 |
| R (sigma) | 0.0266 |
| Goodness-of-fit | 1.151 |
| Final R indices ($R_{all}$) | 0.0212 |
| $wR_{obs}$ | 0.0322 |
| Wavelength | 0.71073 Å |

The electronic band structure of $Cs_2BiAgCl_6$ was calculated based on the experimentally determined crystal structure, with and without relativistic spin-orbit coupling (SOC) effects.

Figure 14:
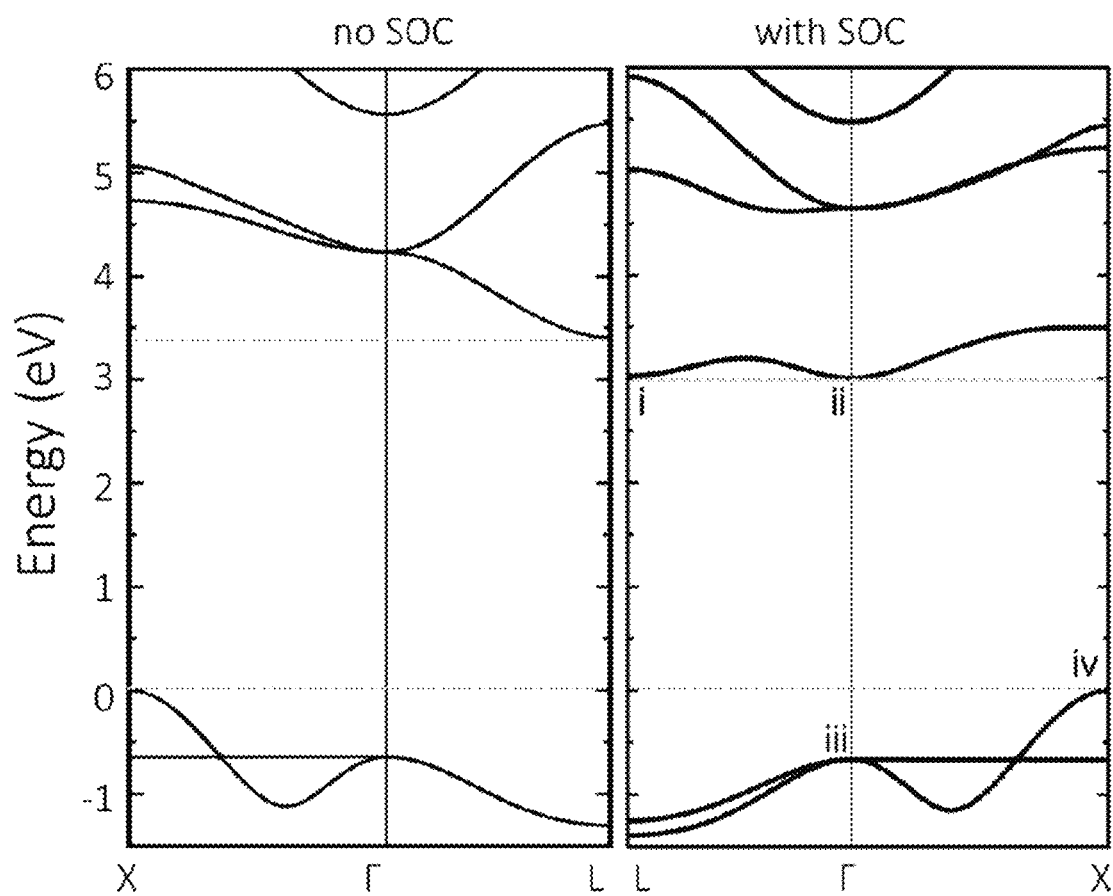
FIG. 14 shows the calculated band structure of the experimentally measured crystal structure for Cs$_2$BiAgCl$_6$.

The results are shown in FIG. 14. The features of the valence band edge are almost unchanged when the relativistic effects are included. This is consistent with the predominant Cl-p and Ag-d character of this band. By contrast, due to the large spin-orbit coupling, the conduction band edge splits in two bands, separated by more than 1.5 eV at the T point. This effect is not surprising, given that the character of the conduction band bottom is of primarily Bi-p character. The fundamental band gap is reduced by 0.4 eV upon inclusion of relativistic effects, and the shape of the conduction band is drastically different. In the fully relativistic case we calculated an indirect band gap of 3.0 eV and lowest direct transition of 3.5 eV. The calculated electronic band gaps are overestimated with respect to the measured optical band gap by approximately 0.5 eV. This quantitative discrepancy does not affect the qualitative physical trends of the band gaps.

In the Example, $Cs_2BiAgCl_6$ was successfully synthesised and found to have a face-centred cubic double perovskite structure. The compound was found to exhibit optical properties consistent with an indirect gap semiconductor. This was in agreement with the computational study.

Example 7—Synthesis and Characterisation of $Cs_2BiAgBr_6$

Solution-Based Synthesis and Crystal Growth of $Cs_2BiAgBr_6$

Samples of $Cs_2BiAgBr_6$ were prepared by precipitation from an acidic solution of hydrobromic acid. A mixture of a 1 mmol $BiBr_3$ (Sigma Aldrich, 99.99%) and AgBr (Sigma Aldrich, 99%) were first dissolved in 12 ml 8.84 M HBr. 2 mmol of CsBr (Sigma Aldrich, 99.9%) were added and the solution was heated to 150° C. to dissolve the salts. The solution was cooled to 118° C. at 4° C./hour to initiate supersaturation and produce single crystals.

High-purity poly crystalline samples were synthesised by the following method. A mixture of 8 ml (8.84 M) HBr and 2 ml 50 wt % $H_3PO_2$ solution was heated to 120° C. and 1.31 mmol of AgBr and $BiBr_3$ dissolved into it. Adding 2.82 mmol of CsBr caused an orange precipitate to form immediately. The hot solution was left for 30 minutes under gentle stirring to ensure a complete reaction before being filtered and the resulting solid washed with ethanol and dried in a furnace.

Synthesis Via Solid-State Reaction

Single-phase samples of $Cs_2BiAgBr_6$ were prepared by conventional solid-state reaction in a sealed fused silica ampoule. For a typical reaction, the starting materials CsBr (Sigma Aldrich, 99.9%), BiBn (Sigma Aldrich, 99.99%) and AgBr (Sigma Aldrich, 99%) were mixed in a molar ratio 2:1:1, respectively. The mixture was loaded in a fused silica ampoule that was flame sealed under vacuum ($10^{-3}$ Torr). The mixture was heated to 500° C. over 5 hours and held at 500° C. for 4 hours. After cooling to room temperature, an orange poly crystalline material was formed which was $Cs_2BiAgBr_6$. Octahedral shaped crystals of maximum size 1 mm$^3$ could be extracted from the powder samples that later were used to determine the crystal structures.

Structural Characterization

Figure 15:
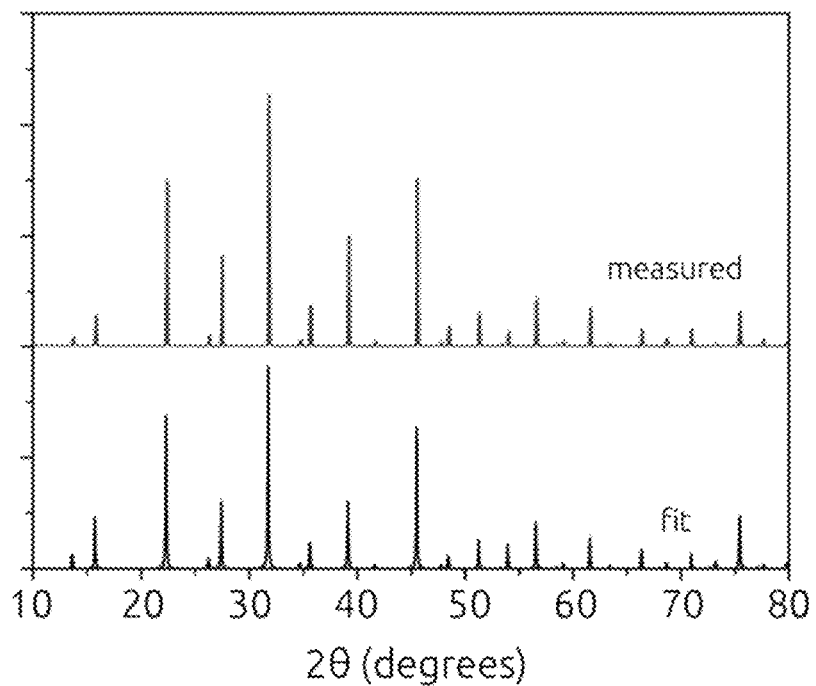
FIG. 15 shows the XRPD pattern for Cs$_2$BiAgBr$_6$.

Powder X-ray diffraction was carried out using a Panalytical X'pert powder diffractometer (Cu-K$\alpha$I radiation; $\lambda$=154.05 pm) at room temperature. The XRPD pattern for $Cs_2BiAgBr_6$ is shown in FIG. 15. Structural parameters were obtained by Rietveld refinement using General Structural Analysis Software. Single crystal data were collected for $Cs_2BiAgBr_6$ at room temperature using an Agilent Supernova diffractometer that uses Mo K$\alpha$ beam with $\lambda$=71.073 pm and is fitted with an Atlas detector. Data integration and cell refinement was performed using CrysAlis Pro Software (Agilent Technologies Ltd., Yamton, Oxfordshire, England). The structure was analysed by Patterson and Direct methods and refined using SHELXL 2014 software package. The single crystal data is shown in Table 2.

TABLE 2 single crystal data for $Cs_2BiAgBr_6$

| Compound | $Cs_2BiAgBr_6$ |
| --- | --- |
| Measurement temperature | 293 K |
| Crystal system | Cubic |
| Space group | Fm-3m |
| Unit cell dimensions | a = 11.264 ± 0.005 Å, $\alpha = \beta = \gamma = 90°$ |
| Volume | 1429.15 Å |
| Z | 4 |
| Density (calculated) | 4.936 g/cm$^3$ |
| Reflections collected | 3830 |
| Unique reflections | 95 from which 0 suppressed |
| R(int) | 0.0691 |
| R (sigma) | 0.0150 |
| Goodness-of-fit | 0.369 |
| Final R indices ($R_{all}$) | 0.0192 |
| $wR_{obs}$ | 0.0676 |
| Wavelength | 0.71073 Å |

Optical Characterization

Figure 16:
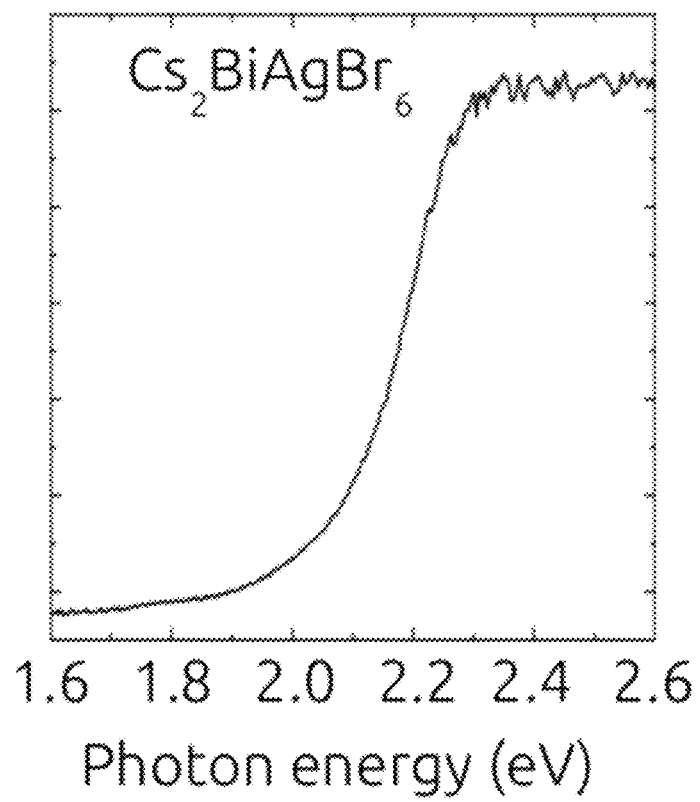
FIG. 16 shows the room temperature optical absorption spectra of Cs$_2$BiAgBr$_6$.

A Varian Cary 300 UV-Vis spectrophotometer with an integrating sphere was used to acquire absorbance spectra and to account for reflection and scattering. The room temperature optical absorption spectra of $Cs_2BiAgBr_6$ is shown in FIG. 16.

Figure 17:
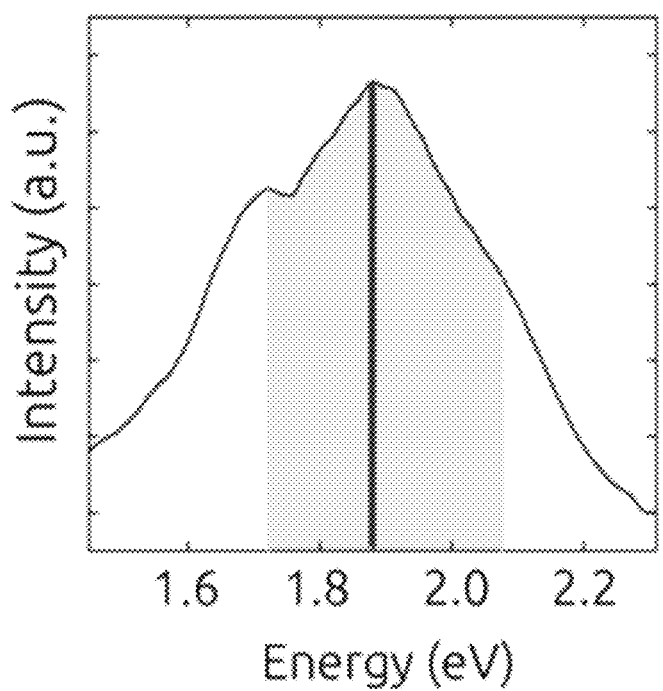
FIG. 17 shows the room temperature photoluminescence spectrum measured for Cs$_2$BiAgBr$_6$.

A 397.7 nm laser diode (Pico-Quant LDH P-C-405) was used for photoexcitation and pulsed at frequencies ranging from 1-80 MHz. The steady-state photoluminescence (PL) measurements were taken using an automated spectrofluorometer (Fluorolog, Horiba Jobin-Yvon), with a 450 W-Xenon lamp excitation. FIG. 17 shows the room temperature photoluminescence spectrum measured for $Cs_2BiAgBr_6$.

The invention claimed is:

1. A semiconductor device comprising a semiconducting material, wherein the semiconducting material comprises a double perovskite compound having a formula selected from:

$(H_2N-C(H)=NH_2)_2AgBiX_{6(1-x)}X'_{6x}$, $(H_2N-C(H)=NH_2)_2AuBiX_{6(1-x)}X'_{6x}$, $(H_2N-C(H)=NH_2)_2AgSbX_{6(1-x)}X'_{6x}$, $(H_2N-C(H)=NH_2)_2AuSbX_{6(1-x)}X'_{6x}$, $(CH_3NH_3)_2AgBiX_{6(1-x)}X'_{6x}$, $(CH_3NH_3)_2AuBiX_{6(1-x)}X'_{6x}$, $(CH_3NH_3)_2AgSbX_{6(1-x)}X'_{6x}$ and $(CH_3NH_3)_2AuSbX_{6(1-x)}X'_{6x}$, wherein:
X is a first halide anion;
X' is a second, different, halide anion; and
x is from 0.01 to 0.99.

2. The semiconductor device according to claim 1, wherein X and X' are selected from I⁻, Br⁻, Cl⁻ and F⁻.

3. The semiconductor device according to claim 1, wherein X is I⁻.

4. The semiconductor device according to claim 1, wherein X' is Br⁻ or Cl⁻.

5. The semiconductor device according to claim 1, wherein x is from 0.05 to 0.95 or from 0.2 to 0.8.

6. The semiconductor device according to claim 1, wherein the semiconductor device is an optoelectronic device.

7. The semiconductor device according to claim 1, wherein the semiconductor device is a photovoltaic device, a light-emitting device, or a photodetector.

8. The semiconductor device according to claim 1, wherein the semiconductor device is a photovoltaic device.

9. The semiconductor device according to claim 1, which semiconductor device comprises a layer of the semiconducting material.

10. The semiconductor device according to claim 9, wherein the layer of the semiconducting material has a thickness of from 5 nm to 1000 nm.

11. The semiconductor device according claim 1, which semiconductor device comprises:
an n-type region comprising at least one n-type layer;
a p-type region comprising at least one p-type layer; and, disposed between the n-type region and the p-type region:
a layer of the semiconducting material.

12. The semiconductor device according to claim 1, which semiconductor device comprises a layer of said semiconducting material without open porosity.

13. The semiconductor device according to claim 11, wherein the layer of the semiconducting material forms a planar heterojunction with the n-type region or the p-type region, or wherein the layer of the semiconducting material forms a first planar heterojunction with the n-type region and a second planar heterojunction with the p-type region.

14. The semiconductor device according to claim 1, wherein the semiconductor device comprises:
an n-type region comprising at least one n-type layer;
a p-type region comprising at least one p-type layer; and, disposed between the n-type region and the p-type region:
(i) a porous scaffold material; and
(ii) said semiconducting material in contact with the scaffold material.

15. The semiconductor device according to claim 11, wherein the n-type region comprises a compact layer of an n-type semiconductor, or wherein the p-type region comprises a layer of an organic p-type semiconductor.

16. The semiconductor device according to claim 1, wherein said semiconducting material is a photoactive material.

17. A process for producing a semiconductor device comprising a semiconducting material, wherein the semiconducting material comprises a double perovskite compound having a formula selected from:

$(H_2N-C(H)=NH_2)_2AgBiX_{6(1-x)}X'_{6x}$, $(H_2N-C(H)=NH_2)_2AuBiX_{6(1-x)}X'_{6x}$, $(H_2N-C(H)=NH_2)_2AgSbX_{6(1-x)}X'_{6x}$, $(H_2N-C(H)=NH_2)_2AuSbX_{6(1-x)}X'_{6x}$, $(CH_3NH_3)_2AgBiX_{6(1-x)}X'_{6x}$, $(CH_3NH_3)_2AuBiX_{6(1-x)}X'_{6x}$, $(CH_3NH_3)_2AgSbX_{6(1-x)}X'_{6x}$ and $(CH_3NH_3)_2AuSbX_{6(1-x)}X'_{6x}$, wherein:
X is a first halide anion;
X' is a second, different, halide anion; and
x is from 0.01 to 0.99,
which process comprises:
(a) disposing a second region on a first region, which second region comprises a layer of said semiconducting material.

18. The process according to claim 17, wherein the process further comprises
(b) disposing a third region on the second region,
wherein:
said first region is an n-type region comprising at least one n-type layer and said third region is a p-type region comprising at least one p-type layer; or
said first region is a p-type region comprising at least one p-type layer and said third region is an n-type region comprising at least one n-type layer.

19. The process according to claim 17, wherein (a) disposing a second region on a first region comprises:
(Ai) exposing the first region to vapour, which vapour comprises said semiconducting material or one or more reactants for producing said semiconducting material; and
(Aii) allowing deposition of the vapour onto the first region to produce a layer of said semiconducting material thereon; or
(Bi) disposing one or more precursor compositions on the first region, which one or more precursor compositions comprise: said semiconducting material and one or more solvents; or one or more reactants for producing said semiconducting material and one or more solvents; and
(Bii) removing the one or more solvents to produce on the first region a layer of said semiconducting material.

20. The process according to claim 19, wherein the one or more reactants for producing the semiconducting material comprise one or more first precursor compounds, one or more second precursor compounds and one or more third precursor compounds,
  which one or more first precursor compounds are selected from compounds of formula A[X];
  which one or more second precursor compounds are selected from compounds of formula $B^I$[X]; and
  which one or more second precursor compounds are selected from compounds of formula $B^{III}$[X]$_3$;
  wherein
  A is the first monocation;
  $B^I$ is the second monocation which is $Ag^+$ or $Au^+$;
  $B^{III}$ is the trication which is $Sb^{3+}$ or $Bi^{3+}$; and
  each [X] is the one or more halide anions.

21. A semiconductor device obtainable by the process for producing a semiconductor device as defined in claim 17.

22. A compound which is a double perovskite compound having a formula selected from:

$(H_2N-C(H)=NH_2)_2AgBiX_{6(1-x)}X'_{6x}$, $(H_2N-C(H)=NH_2)_2AuBiX_{6(1-x)}X'_{6x}$, $(H_2N-C(H)=NH_2)_2AgSbX_{6(1-x)}X'_{6x}$, $(H_2N-C(H)=NH_2)_2AuSbX_{6(1-x)}X'_{6x}$, $(CH_3NH_3)_2AgBiX_{6(1-x)}X'_{6x}$, $(CH_3NH_3)_2AUBiX_{6(1-x)}X'_{6x}$, $(CH_3NH_3)_2AgSbX_{6(1-x)}X'_{6x}$ and $(CH_3NH_3)_2AuSbX_{6(1-x)}X'_{6x}$, wherein:
  X is a first halide anion;
  X' is a second, different, halide anion; and
  x is from 0.01 to 0.99.

23. The compound according to claim 22, wherein X and X' are selected from $I^-$, $Br^-$, $Cl^-$ and $F^-$.

24. The compound according to claim 22, wherein X is $I^-$.

25. The compound according to claim 22, wherein X' is $Br^-$ or $Cl^-$.

26. The compound according to claim 22, wherein x is from 0.05 to 0.95 or from 0.2 to 0.8.

* * * * *